US009735070B2

(12) United States Patent
Park et al.

(10) Patent No.: US 9,735,070 B2
(45) Date of Patent: Aug. 15, 2017

(54) METHODS OF MANUFACTURING LIGHT SOURCE MODULE

(71) Applicant: Samsung Electronics Co., Ltd., Suwon-si, Gyeonggi-do (KR)

(72) Inventors: Dae Seo Park, Suwon-si (KR); Oh Seok Kwon, Hwaseong-si (KR); Ka Ram Lee, Suwon-si (KR); Jong Tae Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/096,600

(22) Filed: Apr. 12, 2016

(65) Prior Publication Data

US 2017/0084504 A1    Mar. 23, 2017

(30) Foreign Application Priority Data

Sep. 17, 2015 (KR) .................. 10-2015-0131440

(51) Int. Cl.
| | |
|---|---|
| *H01L 21/66* | (2006.01) |
| *H04N 3/14* | (2006.01) |
| *H04N 5/225* | (2006.01) |
| *H01L 33/48* | (2010.01) |

(52) U.S. Cl.
CPC ........... *H01L 22/26* (2013.01); *H01L 33/486* (2013.01); *H04N 3/1587* (2013.01); *H04N 5/2253* (2013.01); *H04N 5/2256* (2013.01); *H01L 2933/0033* (2013.01)

(58) Field of Classification Search
CPC ..... H01L 22/26; H01L 33/486; H04N 3/1587; H04N 5/2253; H04N 5/2256
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2014-085283 A | 5/2014 |
| JP | 2015-55631 A | 3/2015 |

(Continued)

*Primary Examiner* — Karen Kusumakar
(74) *Attorney, Agent, or Firm* — Harness, Dickey & Pierce P.L.C.

(57) ABSTRACT

Manufacturing a light source module may include mounting light emitting devices on substrates on an upper surface of a carrier, mounting optical devices to cover the light emitting devices, and inspecting the light emitting devices and the optical devices based on selectively capturing images thereof. Images may be captured based on controlling a light source module scanner assembly on the carrier. The substrates may extend in a first direction and may be spaced apart in a second direction. Controlling the light source module scanner assembly may include moving the light source module scanner assembly along a selected direction to position the light source module scanner assembly on at least one of the light emitting devices and the optical devices. The direction may be selected based on the quantity of substrates and the quantity of light emitting devices and optical devices on each of the substrates.

20 Claims, 17 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,687,181 B2 * | 4/2014 | Hsu .......................... G01J 1/42 356/218 |
| 8,735,931 B2 | 5/2014 | Han et al. |
| 8,766,295 B2 | 7/2014 | Kim |
| 2004/0213449 A1 * | 10/2004 | Safaee-Rad ........... G06T 7/0004 382/141 |
| 2009/0136120 A1 * | 5/2009 | Onushkin ............ G01N 21/956 382/149 |
| 2010/0188656 A1 | 7/2010 | Matsui et al. |
| 2010/0246936 A1 * | 9/2010 | Ji .......................... G06K 9/2018 382/149 |
| 2012/0193661 A1 * | 8/2012 | Emerson .................. H01L 33/20 257/98 |
| 2015/0085067 A1 | 3/2015 | Mueller et al. |
| 2015/0355053 A1 | 12/2015 | Ji et al. |
| 2016/0133805 A1 | 5/2016 | Park et al. |

FOREIGN PATENT DOCUMENTS

| | | |
|---|---|---|
| KR | 10-2008-0029205 A | 4/2008 |
| KR | 10-2008-0102728 A | 11/2008 |
| KR | 10-2009-0110495 A | 10/2009 |
| KR | 10-2012-0048130 A | 5/2012 |
| KR | 10-2014-0129426 A | 11/2014 |
| KR | 10-2014-0143270 A | 12/2014 |
| KR | 10-2015-0034419 A | 4/2015 |
| KR | 10-2016-0056167 | 5/2016 |

* cited by examiner

METHODS OF MANUFACTURING LIGHT SOURCE MODULE

CROSS-REFERENCE TO RELATED APPLICATION

This application claims the priority and benefit of Korean Patent Application No. 10-2015-0131440 filed on Sep. 17, 2015, with the Korean Intellectual Property Office, the disclosure of which is incorporated herein by reference.

BACKGROUND

Example embodiments of the inventive concepts relate to manufacturing a light source module.

Due to stated customer preference in the fields of display devices and light emitting devices using light emitting diodes (LEDs) as light sources, important considerations in light source module manufacturing may include value engineering (VE) designs that enable reduced device sizes and reductions in production costs. Altering lenses may allow these conditions to be satisfied. Lenses may decrease optical distances between LEDs and a target plane and may increase a pitch between the LEDs.

In an LED module manufactured through a surface-mount technology (SMT) process of an LED and a lens, the degree of coaxial precision of the LED and the lens may affect the quality of the light source module. For example, defects in the degree of coaxial precision may cause defects in optical uniformity including a Mura phenomenon. Therefore, inspection of a state in which the lens and the LED are mounted may be important.

In some cases, and in accordance with a decrease in the degree of integration of LEDs, an inspection method according to which inspection of a state in which the lens and the LED are mounted is implemented may have limitations such as a reduction in process efficiency and a consequent decrease in productivity.

SUMMARY

Some example embodiments of the inventive concepts may provide a method of manufacturing a light source module. Some example embodiments may provide increased product reliability and manufacturing productivity based on inspecting a cause of an optical uniformity defect such as Mura phenomenon and removing the cause in the manufacturing of the light source module.

According to some example embodiments, a method of manufacturing a light source module may include disposing a plurality of substrates on an upper surface of a carrier, mounting a plurality of light emitting devices on the plurality of substrates, mounting a plurality of optical devices to cover the plurality of light emitting devices on the plurality of substrates, and selectively capturing at least one image of each of the light emitting devices and the optical devices, based on controlling an light source module scanner assembly on the upper surface of the carrier. The plurality of substrates may respectively extend in parallel and in a first direction. The plurality of substrates may be spaced apart in a second direction. The second direction may be substantially perpendicular to the first direction. The controlling may include selectively moving the light source module scanner assembly along the first section or the second direction to position the light source module scanner assembly on at least one of the light emitting devices and the optical devices, and controlling the light source module scanner assembly to capture an image of the at least one of the light emitting devices and the optical devices.

According to some example embodiments, a method of manufacturing a light source module may include selectively capturing at least one image of each of a plurality of light emitting devices on a plurality of substrates and a plurality of optical devices on the plurality of light emitting devices, based on controlling an light source module scanner assembly on an upper surface of a carrier. The plurality of substrates may be on the upper surface of the carrier. The plurality of substrates may respectively extend in parallel and in a first direction, the plurality of substrates may be spaced apart in a second direction, and the second direction may be substantially perpendicular to the first direction. Controlling the light source module scanner assembly may include selectively rotating the light source module scanner assembly to align the light source module scanner assembly with a selected movement direction, the movement direction being a selected one of the first direction or the second direction, and moving the light source module scanner assembly along the selected movement direction to position the light source module scanner assembly on at least one of the light emitting devices and the optical devices.

According to some example embodiments, a method may include selectively capturing at least one image of each of a plurality of light emitting devices. The plurality of light emitting devices may include a plurality of rows of light emitting devices. Each row may extend in a first direction. The rows may be spaced apart in a second direction. The selectively capturing may include selecting a movement direction, the movement direction being one of the first direction or the second direction, based on a quantity of the rows, and a quantity of light emitting devices included in each of the rows, and moving the light source module scanner assembly along the selected movement direction to position the light source module scanner assembly on at least one of the light emitting devices.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
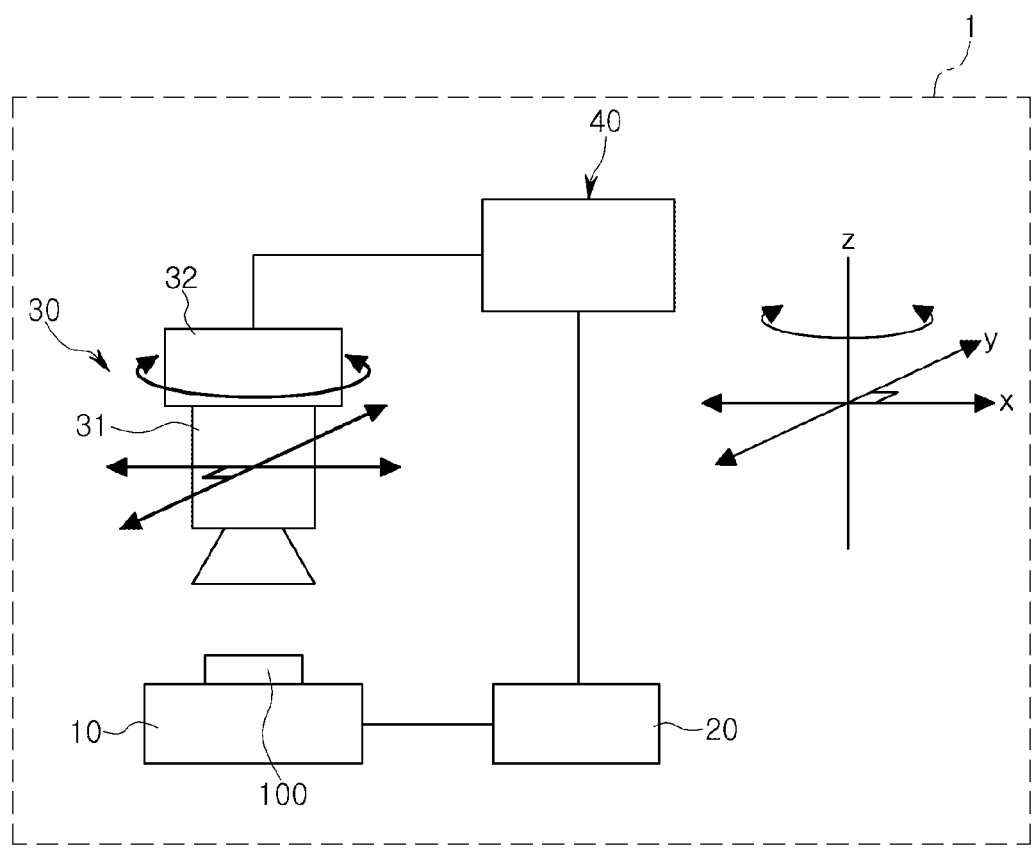
FIG. 1 is a block diagram schematically illustrating a configuration of an apparatus for inspecting a light source module according to some example embodiments of the inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Hereinafter, example embodiments of the inventive concepts will be described with reference to schematic views illustrating some example embodiments of the inventive concepts. In the drawings, for example, due to manufacturing techniques and/or tolerances, modifications of the shape shown may be estimated. Thus, some example embodiments of the inventive concepts should not be construed as being limited to the particular shapes of regions shown herein, for example, to include a change in shape results in manufacturing. The following embodiments may also be constituted by one or a combination thereof.

The example embodiments described below may have a variety of configurations, but are not limited thereto.

In the drawings, the shapes and dimensions of elements may be exaggerated for clarity, and the same reference numerals will be used throughout to designate the same or like elements. In the specification, the terms 'above', 'upper portion', 'upper surface', 'below' 'lower portion', 'lower surface', 'side or lateral surface' and the like, are used based on the directionality of the drawings, and may actually be different depending on a direction in which a component is disposed.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a configuration of the apparatus for inspecting a light source module according to some example embodiments of the inventive concepts.

As illustrated in FIG. 1, an apparatus 1 for inspecting a light source module according to some example embodiments of the inventive concepts may include a carrier support pedestal 10, a power supply unit 20, an light source module scanner assembly 30, and a scanner control device 40.

The inspection of a light source module 100 may include controlling the light source module scanner assembly 30 to selectively capture one or more images of one or more portions of the light source module 100. Controlling the light source module scanner assembly 30 may include adjustably positioning the light source module scanner assembly 30 on one or more particular portions of the light source module 100.

The inspection of a light source module 100 may include at least one of determining whether or not the light source module 100 is defective, using data captured and obtained by the light source module scanner assembly 30 in a state in which the light source module 100 is turned on ("activated"). Such determining may include processing one or more images captured by the light source module scanner assembly 30.

Figure 2A:
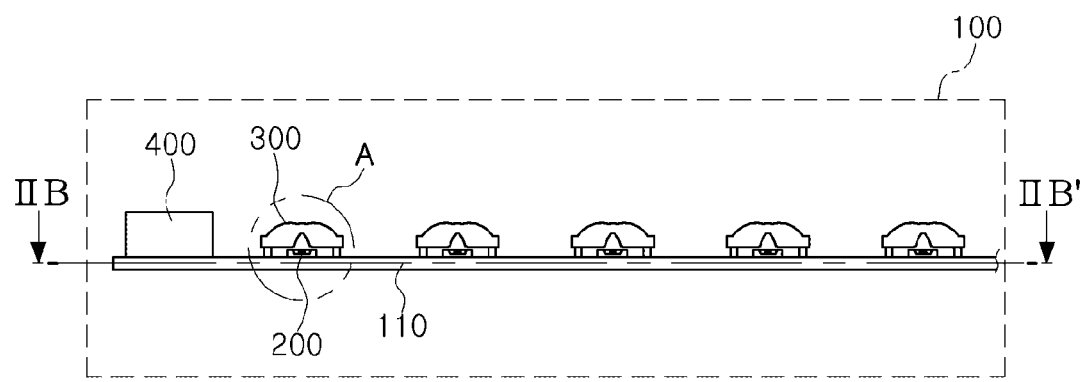
FIGS. 2A and 2B are a cross-sectional view and a plan view schematically illustrating a light source module according to some example embodiments of the inventive concepts.
Figure 2B:
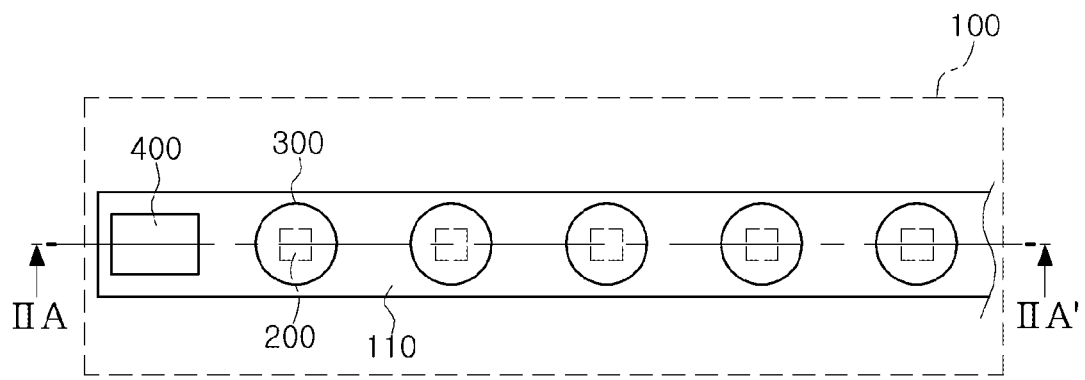
Figure 3:
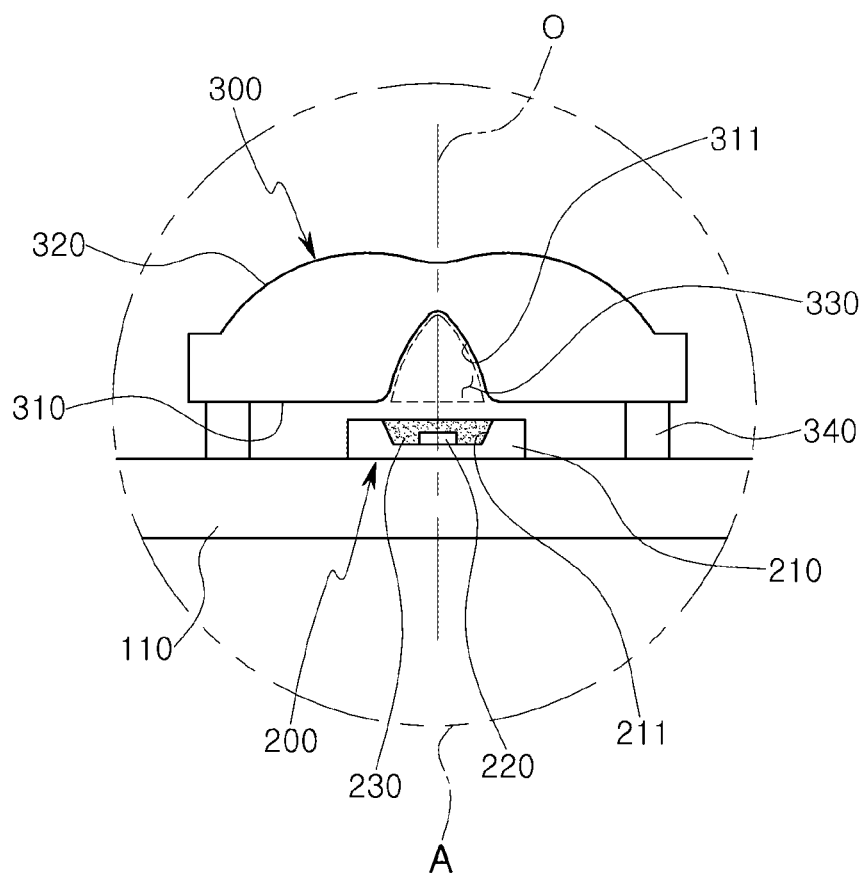
FIG. 3 is an enlarged cross-sectional view of portion "A" of FIG. 2A.

FIG. 2A, FIG. 2B, and FIG. 3 schematically illustrate alight source module according to some example embodiments of the inventive concepts. FIGS. 2A and 2B are a cross-sectional view and a plan view schematically illustrating a light source module according to some example embodiments of the inventive concepts. FIG. 2A is a cross-sectional view along line IIA-IIA' of FIG. 2B, and FIG. 2B is a plan view along line IIB-IIB' of FIG. 2A. FIG. 3 is an enlarged cross-sectional view of portion "A" of FIG. 2A.

Referring to FIG. 2A, FIG. 2B, and FIG. 3, the light source module 100 according to some example embodiments of the inventive concepts may include a substrate 110, a plurality of light emitting devices 200 mounted on the substrate 110, and a plurality of optical devices 300 disposed on the plurality of light emitting devices 200.

The substrate 110 may be a printed circuit board (PCB). For example, the substrate 110 may be a FR4-type PCB or a flexible PCB that is configured to be deformed. The substrate 110 may be formed of an organic resin material containing epoxy, triazine, silicon, polyimide and the like, or other organic resin materials. In some example embodiments, the substrate 110 may be formed of a ceramic material such as silicon nitride, AlN, Al2O3 or the like, or may be formed of a metal and a metal compound such as a metal core printed circuit board (MCPCB), MCCL and the like.

The substrate 110 may have a rectangular bar structure, elongated in a lengthwise direction. However, the structure of the substrate 110 according to some example embodiments is merely provided by way of example, and is not limited thereto. The lengthwise direction may be referred to herein as a direction along a longitudinal axis of the substrate 110.

The light emitting devices 200 may be optoelectronic devices generating light having a desired (or, alternatively, predetermined) wavelength through externally applied driving power. For example, the light emitting devices 200 may include a semiconductor light emitting diode (LED) including an n-type semiconductor layer and a p-type semiconductor layer, and an active layer interposed therebetween.

The light emitting devices 200 may emit blue light, green light or red light according to a material contained therein or a combination thereof with a phosphor. In some example embodiments, the light emitting devices 200 In some example embodiments, may emit white light, ultraviolet light or the like. The light emitting devices 200 may be variously configured, such as the same type of light emitting devices generating light having the same wavelength or different types of light emitting devices generating light of different wavelengths. In addition, the light emitting devices 200 may be variously configured depending on the use of a power level such as 0.5 W and 1 W.

The light emitting devices 200 may include one or more light emitting diode (LED) chips having one or more various structures. The light emitting devices 200 may include an LED package. The LED package may include one or more of the LED chips. The LED package may be formed according to one or more various processes. The LED package may include one or more various LED chip configurations.

As illustrated in FIG. 3, the light emitting device 200 may include a package structure in which an LED chip 220 is mounted on a package body 210 having a reflective cup 211. The LED chip 220 may be covered by an encapsulating part 230 containing phosphors. The example embodiments illustrated in FIG. 3 include light emitting devices 200 in a form of an LED package, but is not limited thereto.

The package body 210 may correspond to a base member on which the LED chip 220 is mounted and is supported thereby. The package body 210 may be formed of a white molding compound having a high degree of light reflectivity, whereby effects of increasing the quantity of outwardly emitted light by reflecting light emitted by the LED chip 220 may be provided. Such a white molding compound may contain a thermosetting resin having high heat resistance or a silicon resin. In addition, the white molding compound may be formed of FR-4, CEM-3, an epoxy material, a ceramic material or the like. Further, the white molding compound may be formed of a metal such as aluminum (Al).

The LED chip 220 may be enclosed by the encapsulating part 230 formed within the reflective cup 211 of the package body 210. The encapsulating part 230 may contain a wavelength conversion material.

The wavelength conversion material contained in the encapsulating part 230 may contain at least one or more phosphors excited by light generated by the LED chip 220 and emitting light of different wavelengths. By doing so, a control may be made such that various colors of light as well as white light may be emitted.

For example, in a case in which the LED chip 220 emits blue light, white light may be emitted by combining yellow, green, red, and/or orange colored phosphors. In addition, the LED chip 220 may be configured to include at least one LED chip emitting violet, blue, green, red or ultraviolet light. In this case, a color rendering index (CRI) of the LED chip 220 may be adjusted from about 40 to 100, and the LED chip 220 may generate various types of white light with color temperatures ranging from about 2000K to 20000K. In some example embodiments, the LED chip 220 may generate visible violet, blue, green, red or orange light or infrared light to adjust the color of light according to a surrounding atmosphere and a desired user mood. Also, the LED chip 220 may generate a specific wavelength of light for promoting growth of plants.

Figure 4:
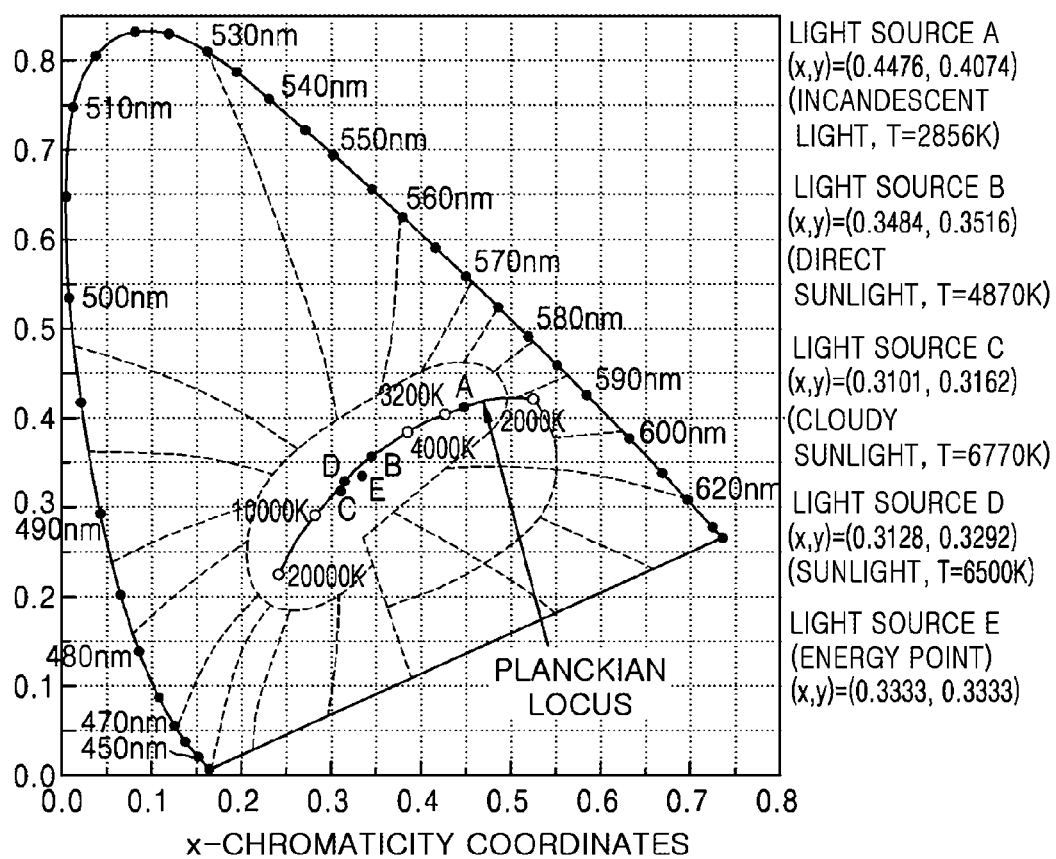
FIG. 4 is the CIE 1931 chromaticity diagram illustrating a wavelength conversion material employable according to some example embodiments of the inventive concepts.

White light formed by combining yellow, green or red phosphors with a blue LED chip and/or combining green and red LED chips may have two or more peak wavelengths, and coordinates (x, y) thereof in the CIE 1931 chromaticity diagram of FIG. 4 may be positioned on a line segment connecting (0.4476, 0.4074), (0.3484, 0.3516), (0.3101, 0.3162), (0.3128, 0.3292), and (0.3333, 0.3333). In some example embodiments, coordinates (x, y) thereof in the CIE 1931 chromaticity diagram may be positioned in a region surrounded by the line segment and blackbody radiation spectrum. The color temperature of white light may range from about 2000K to 20000K.

In FIG. 4, white light in the vicinity of point E (0.3333, 0.3333), disposed below the blackbody radiation spectrum, may be in a state in which a level of yellow light is relatively low and may be used as a lighting light source in a region exhibiting a brighter or fresher feeling. Therefore, lighting products using white light in the vicinity of point E (0.3333, 0.3333), disposed below the blackbody radiation spectrum, may be highly effective as lighting devices for retail spaces offering groceries, clothes and the like for sale.

The phosphors may have the following compositional formulas and colors:

Oxides: yellow and green $Y_3Al_5O_{12}:Ce$, $Tb_3Al_5O_{12}:Ce$, $Lu_3Al_5O_{12}:Ce$;

Silicates: yellow and green $(Ba,Sr)_2SiO_4:Eu$, yellow and orange $(Ba,Sr)_3SiO_5:Ce$;

Nitrides: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$) (where, Ln is at least one element selected from a group consisting of group IIIa elements and rare-earth elements, and M is at least one element selected from a group consisting of Ca, Ba, Sr and Mg);

Fluorides: KSF-based red $K_2SiF_6:Mn^{4+}$, $K_2TiF_6:Mn^{4+}$, $NaYF_4:Mn^{4+}$, $NaGdF_4:Mn^{4+}$ and $K_3SiF_7:Mn^{4+}$;

Phosphor compositions may basically conform to stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La)-based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level of light, and an activator may be applied alone or with a co-activator for modifying characteristics of phosphors.

In particular, in order to enhance reliability at high temperatures and high humidity, a fluoride-based red phosphor may be coated with a fluoride not containing manganese (Mn) or with organic materials thereon. The organic materials may be coated on the fluoride-based red phosphor coated with a fluoride not containing manganese (Mn). Unlike other phosphors, the fluoride-based red phosphor may realize a narrow full width at half maximum (FWHM) equal to or less than 40 nm, and thus, it may be utilized in high resolution TVs such as UHD TVs.

Further, as a material to be substituted for the phosphor, a quantum dot (QD) or the like may be used in the wavelength conversion material, and the QD may be used alone or in combination with the phosphor.

The quantum dot may have a core-shell structure using group III-V or group II-VI compound semiconductors. For example, the quantum dot may have a core such as CdSe or InP or a shell such as ZnS or ZnSe. Also, the quantum dot may include a ligand to stabilize the core and shell. For example, the core may have a diameter ranging from about 1 nm to 30 nm, particularly, about 3 nm to 10 nm. The shell may have a thickness ranging from about 0.1 nm to 20 nm, particularly, 0.5 nm to 2 nm.

The quantum dot may realize various colors of light according to a size thereof and, in particular, when the quantum dot is used as a phosphor substitute, it may be substituted for a red or green phosphor. The use of the quantum dot may allow a narrow FWHM (e.g., about 35 nm) to be realized.

Each of the optical devices 300 may be disposed on the light emitting device 200 and may adjust a beam angle of light emitted by the light emitting device 200. The optical device 300 may include a wide beam angle lens for implementing a wide angle of beam spread by diffusing light of the light emitting device 200.

Each optical device 300 may have a first surface 310 having an incident portion 311 facing the light emitting device 200 and a second surface 320 disposed to oppose the first surface 310.

The first surface 310 may have a recess portion 330 recessed toward the second surface 320 in a central portion thereof through which an optical axis Z passes. The recess portion 330 may have a rotationally symmetrical structure with respect to the optical axis Z passing through a central portion of the optical device 300, and a surface thereof may define the incident portion 311 through which light from the light emitting device 200 is incident. The recess portion 330 may be exposed externally through the first surface 310 and may be disposed to face the light emitting device 200.

The first surface 310 may have a support portion 340 protruding toward the light emitting device 200. The support portion 340 may be provided as a plurality of support portions 340 disposed along a circumferential portion of the recess portion 330 to surround the recess portion 330.

When the optical device 300 is mounted on the substrate 110, the support portions 340 may fix and support the optical device 300. That is, the optical device 300 may be mounted on the substrate 110 by the support portions 340.

The second surface 320 may be disposed to oppose the first surface 310. The second surface 320, a light emitting surface from which the light incident through the incident portion 311 is emitted outwardly, may be atop surface of the optical device 300. The second surface 320 may protrude convexly in an upward direction in which light proceeds from an edge thereof connected to the first surface 310.

The optical device 300 may be formed of a resin material having light-transmissive properties and for example, may contain polycarbonate (PC), polymethyl methacrylate (PMMA), an acrylic material, or the like. In addition, the optical device 300 may be formed of glass, but is not limited thereto.

The optical device 300 may contain a light dispersion material in a range of about 3% to 15%. The light dispersion material may include at least one selected from a group consisting of $SiO_2$, $TiO_2$ and $Al_2O_3$. In a case in which the light dispersion material is included in an amount of less than 3%, light may not be sufficiently dispersed, such that light dispersion effects may not be expected. In a case in which the light dispersion material is included in an amount greater than 15%, a quantity of light emitted outwardly through the optical device 300 may be reduced to thereby degrade light extraction efficiency.

The optical device 300 may be formed by schemes of injecting a liquid solvent into a mold to be solidified. For example, the schemes may include an injection molding method, a transfer molding method, a compression molding method and the like.

In some example embodiments, in addition to the plurality of light emitting devices 200 and the plurality of optical devices 300, a connector 400 may be mounted on the substrate 110 to be connected to an external power source. The connector 400 may be disposed in one end portion of the substrate 110.

Referring to FIG. 1 again, the carrier support pedestal 10 may support the light source module 100, an object that may be inspected. A single substrate 110 or a plurality of substrates 110 on which the light emitting devices 200 and the optical devices 300 are mounted may be arranged on a carrier and may be disposed on one surface of the carrier support pedestal 10.

The power supply unit 20 (also referred to herein as a "power supply," "power source," etc.) may supply a current to the plurality of light emitting devices 200 in such a manner that the plurality of light emitting devices 200 may be turned on. The power supply unit 20 may be driven by an external signal and may turn the light emitting device 200, the object to be inspected, on or off.

The light source module scanner assembly 30 may image the plurality of light emitting devices 200 and the plurality of optical devices 300 to obtain images thereof in a state in which the plurality of light emitting devices 200 are turned on. For example, a camera, a type of imaging element, may be used as the light source module scanner assembly 30, but the inventive concepts are not limited thereto. Besides the camera, any device may be used as long as it can image an object to sense or obtain an image thereof.

The light source module scanner assembly 30 may include a camera assembly 31 and a rotating jig 32 connected to the camera assembly 31. The rotating jig 32 may be configured to rotate the camera assembly 31.

The light source module scanner assembly 30 may be disposed above the carrier support pedestal 10 and may selectively capture one or more images of the plurality of light emitting devices 200 and the plurality of optical devices 300 while moving in a selected direction. The selected direction may be referred to herein as the selected "movement direction."

The scanner control device 40 may control the light source module scanner assembly 30 and the power supply unit 20. At least one of the power supply unit 20 and the light source module scanner assembly 30 may be controlled based on one or more instances of information. The one or more instances of information may include one or more of the quantities and positions of at least one of the plurality of substrates 110, the plurality of light emitting devices 200, and the plurality of optical devices 300. Such information may be stored in the scanner control device 40.

In some example embodiments, the scanner control device 40 may determine whether or not the light emitting devices 200 and the optical devices 300 are defective based on processing one or more captured images of the light emitting devices and the optical devices. The images may be captured by the light source module scanner assembly 30 and communicated to the scanner control device 40 light source module scanner assembly.

A method of manufacturing a light source module according to some example embodiments of the inventive concepts will be described with reference to FIG. 5, FIG. 6, FIG. 7A, FIG. 7B, FIG. 8, FIG. 9, and FIG. 10. FIG. 5, FIG. 6, FIG. 7A, FIG. 7B, FIG. 8, FIG. 9, and FIG. 10 10 schematically illustrate respective processes of manufacturing the light source module.

Figure 5:
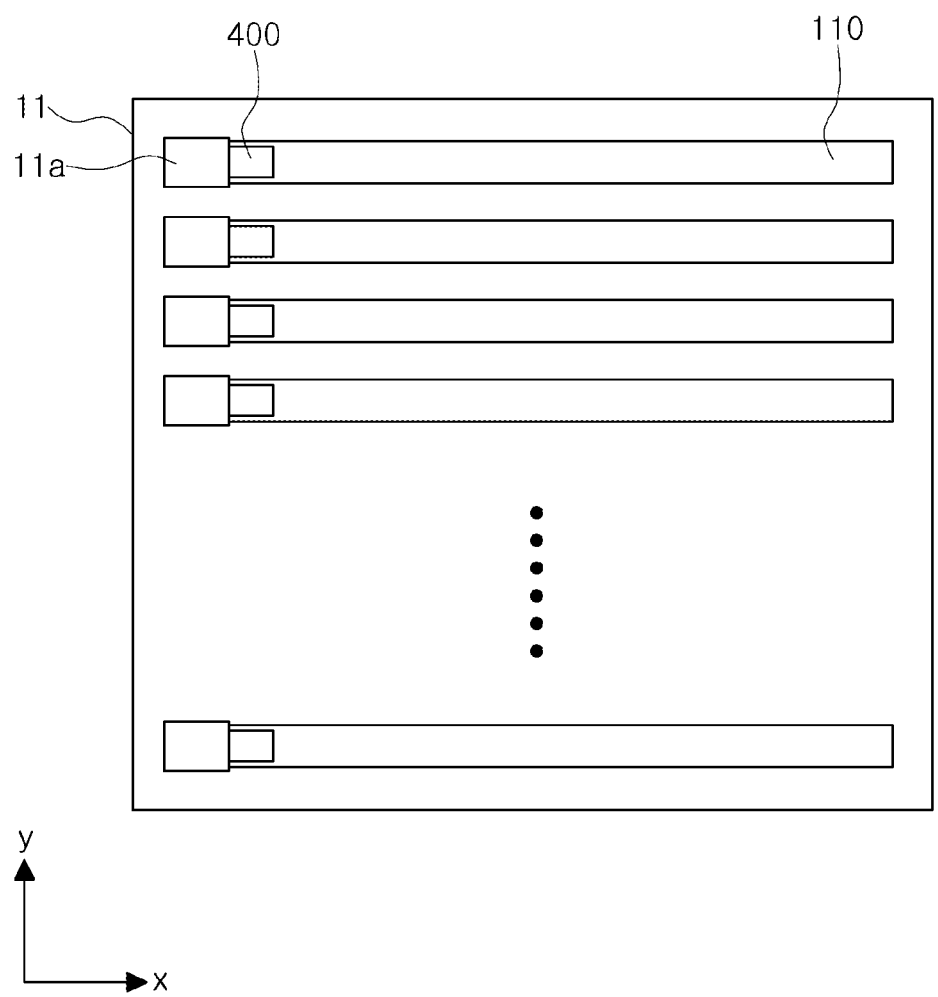
FIG. 5 is a plan view schematically illustrating a process of disposing a plurality of substrates on a carrier according to some example embodiments of the inventive concepts.

As illustrated in FIG. 5, the plurality of substrates 110 may be disposed on an upper surface of a carrier 11.

A substrate 110 may be a printed circuit board (PCB). For example, a substrate 110 may be a FR4-type PCB or a flexible PCB configured to be deformed. A substrate 110 may be formed of an organic resin material containing epoxy, triazine, silicon, polyimide and the like, or other organic resin materials. In some example embodiments, the substrate 110 may be formed of a ceramic material such as silicon nitride, AlN, $Al_2O_3$ or the like, or may be formed of a metal and a metal compound such as a metal core printed circuit board (MCPCB), MCCL and the like.

The substrate 110 may have a rectangular bar structure, elongated in a lengthwise direction. However, the structure of the substrate 110 according to some example embodiments is merely provided by way of example, but is not limited thereto.

The plurality of substrates 110 disposed on the upper surface of the carrier 11 may be respectively extended in parallel in a first direction and may be spaced apart from one another at desired (or, alternatively, predetermined) intervals in a second direction perpendicular to the first direction. For example, in the drawings, the first direction may be defined as an x-axis direction and the second direction may be defined as a y-axial direction. In addition, the first direction may correspond to a longitudinal axis of the substrates 110 and may correspond to a movement direction of the carrier 11. In some example embodiments, the carrier 11 may be moved along the movement direction. The carrier 11 may be moved independently of the light source module scanner assembly 30 being moved on the carrier 11.

Each of the plurality of substrates 110 disposed on the carrier 11 may be electrically connected to a terminal 11a of the carrier 11 through the connector 400.

Figure 6:
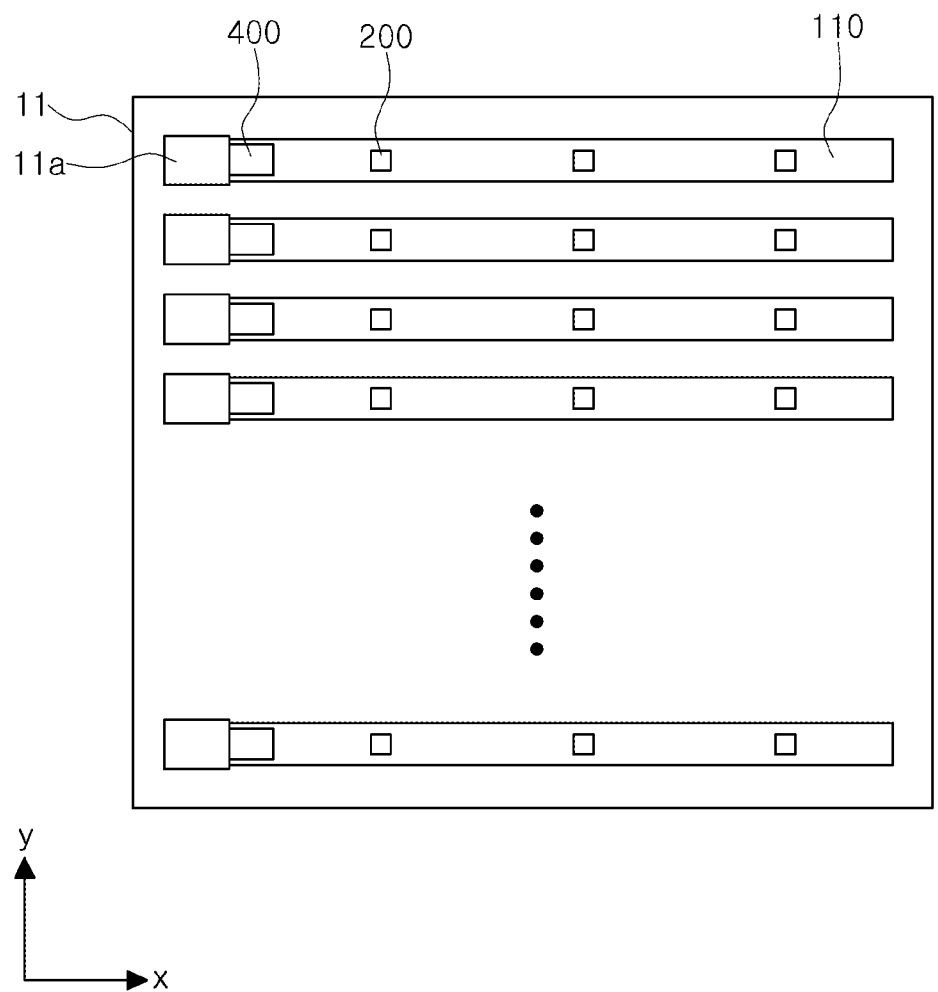
FIG. 6 is a plan view schematically illustrating a process of mounting a plurality of light emitting devices on the plurality of substrates on the plurality of substrates according to some example embodiments of the inventive concepts.
Figure 7A:
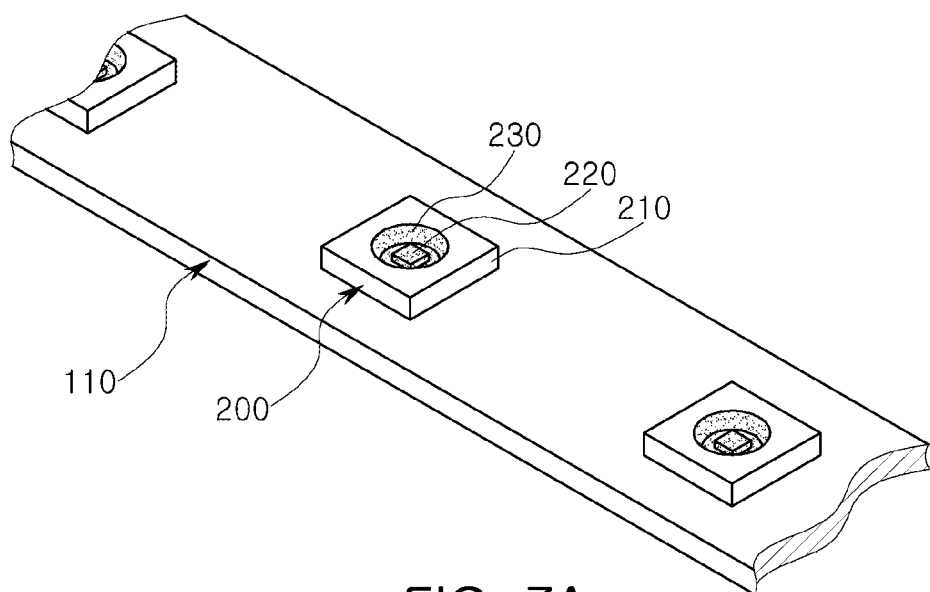
FIGS. 7A and 7B are a perspective view and a cross-sectional view schematically illustrating a state in which the light emitting devices are mounted on the substrate according to some example embodiments of the inventive concepts.
Figure 7B:
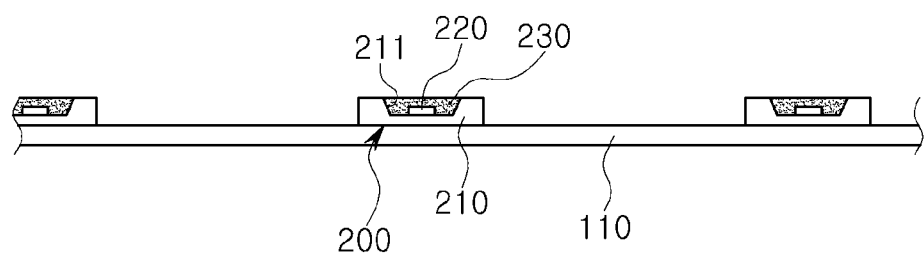

As illustrated in FIG. 6, FIG. 7A, and FIG. 7B, the plurality of light emitting devices 200 may be mounted on each of the substrates 110.

The plurality of light emitting devices 200 may be arranged on each of the substrates 110 in the lengthwise direction, that is, in the first direction (x-axis direction). The light emitting devices 200 may be optoelectronic devices generating light having a desired (or, alternatively, predetermined) wavelength through externally applied driving power. For example, the light emitting devices 200 may include a semiconductor light emitting diode (LED) including an n-type semiconductor layer and a p-type semiconductor layer, and an active layer interposed therebetween.

The light emitting devices 200 may be light emitting diode (LED) chips having various structures or an LED package including the LED chips and formed in various manners. In some example embodiments, the light emitting devices 200 are provided in a form of an LED package.

In some example embodiments, the plurality of light emitting devices 200 are mounted on each of the substrates 110 if and/or when the plurality of substrates 110 are disposed on the carrier 11. In some example embodiments, the substrates 110 may be also disposed on the carrier 11 in a state in which the plurality of light emitting devices 200 are mounted on each of the substrates 110. That is, the order of disposing the substrates 110 on the carrier 110 and mounting the plurality of light emitting devices 200 on each of the substrates 110 may be reversed.

Figure 8:
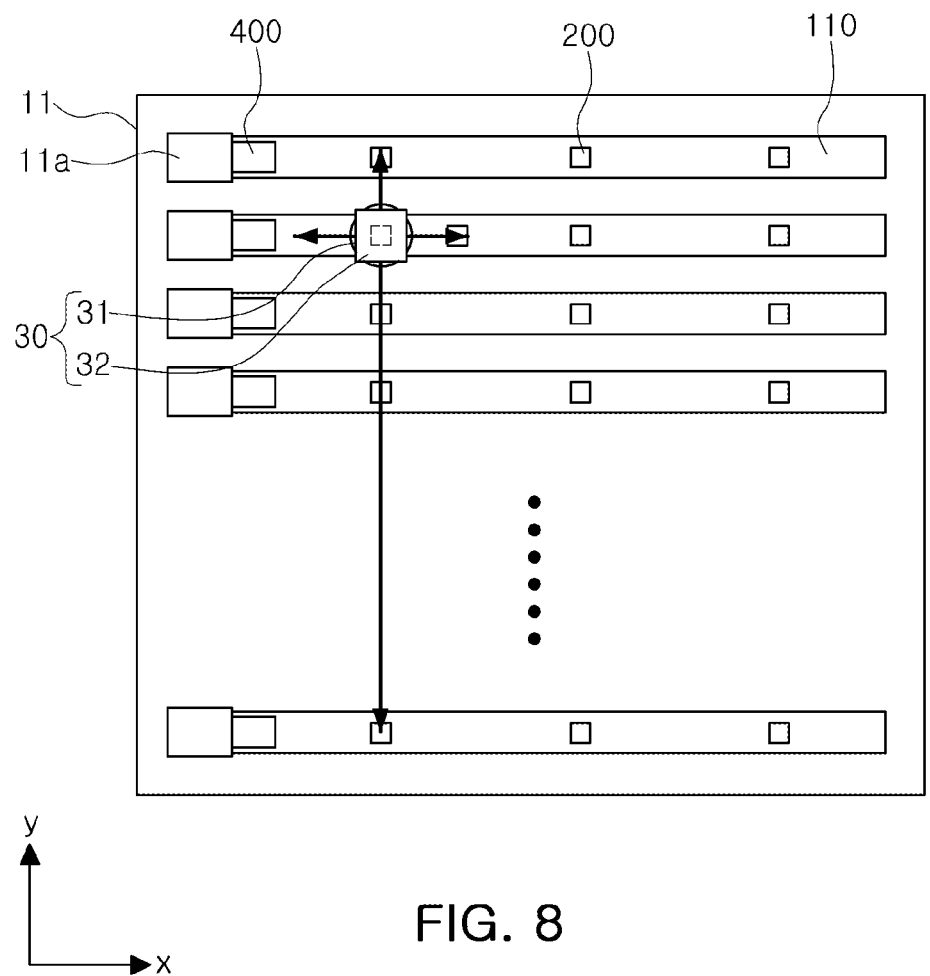
FIG. 8 is a plan view schematically illustrating a process of inspecting the plurality of light emitting devices according to some example embodiments of the inventive concepts.

As illustrated in FIG. 8, the inspection of the plurality of light emitting devices 200 may be performed (a first inspection process).

The inspection of the plurality of light emitting devices 200 may include selectively capturing at least one image of each of the plurality of light emitting devices 200. The inspection of the plurality of light emitting devices 200 may include processing one or more of the captured images of a light emitting device 200 to determine whether the light emitting device 200 is defective. The inspection of the plurality of light emitting devices 200 may be performed through an automatic optical inspection using the apparatus 1 for inspecting the light source module (refer to FIG. 1).

For example, when the carrier 11 is moved ("translated") in the first direction and is disposed on the carrier support pedestal 10, a current may be supplied to the plurality of light emitting devices 200 through the power supply unit 20 and thus, one or more of the plurality of light emitting devices 200 may be turned on ("selectively activated"). Then, one or more images of the plurality of light emitting devices 200 may be captured by the light source module scanner assembly 30 while the upper surface of the carrier 11 may be scanned by the light source module scanner assembly 30. The light source module scanner assembly 30 may include the camera assembly 31 and the rotating jig 32 connected to the camera assembly 31.

The camera assembly 31 may select a movement direction that is the first direction or the second direction and may capture one or more images of the plurality of light emitting devices 200 while moving in the corresponding selected movement direction. The camera assembly 31 may include, for example, at least one of an area scanning camera and a line scanning camera, but is not limited thereto. The light source module scanner assembly 30 may include one or more devices configured to capture an image of an object. In some example embodiments, the camera assembly 31 includes a line scanning camera.

The rotating jig 32 may selectively rotate the camera assembly 31 in such a manner that the camera assembly 31 is aligned with a selected movement direction of the first direction or the second direction and thus may move in the selected movement direction. A camera assembly that is "aligned" with a direction is configured to be moved in the direction.

The scanner control device 40 may determine whether or not the light emitting devices 200 are defective based on processing data obtained by the light source module scanner assembly 30. Such data may include one or more images captured by the light source module scanner assembly 30, where the captured one or more images are images of the light emitting devices 200. The defects of the light emitting device 200 may include an operational defect in which the light emitting device 200 is not turned on (is deactivated), a positional defect in which the light emitting device 200 is not mounted in a correct position, a mounting defect in which the light emitting device 200 is mounted in a tilted state, some combination thereof, and the like.

In some example embodiments, when the operational defect is detected in a portion of the light emitting devices 200, a process of replacing the corresponding defective light emitting device 200 with a good product may be performed. In addition, the substrate 110 on which a defective light emitting device has been replaced with a good light emitting device 200 may be regrouped or remounted on the carrier 11.

The scanner control device 40 may control the light source module scanner assembly 30. For example, the scanner control device 40 may select a movement direction of the camera assembly 31, of the first direction or the second direction, and may rotate the camera assembly 31 to align with the selected movement direction by controlling the rotating jig 32.

In detail, based on at least one of the quantity of substrates 110 arranged on the carrier 11 and the quantity of light emitting devices 200 mounted on each of the substrates 110, the movement direction of the light source module scanner assembly 30 may be selected. In response to selecting the movement direction, the scanner control device 40 may determine whether or not to rotate the camera assembly 31 to align with the selected movement direction. For example, when the movement direction is selected such that the camera assembly 31 performs imaging while moving in the second direction, and the camera assembly 31 is disposed ("aligned") in the first direction, the camera assembly 31 may be rotated by the rotating jig 32 in such a manner that it is directed ("aligned") in the second direction.

In addition, the scanner control device 40 may control the power supply unit 20.

Figure 9:
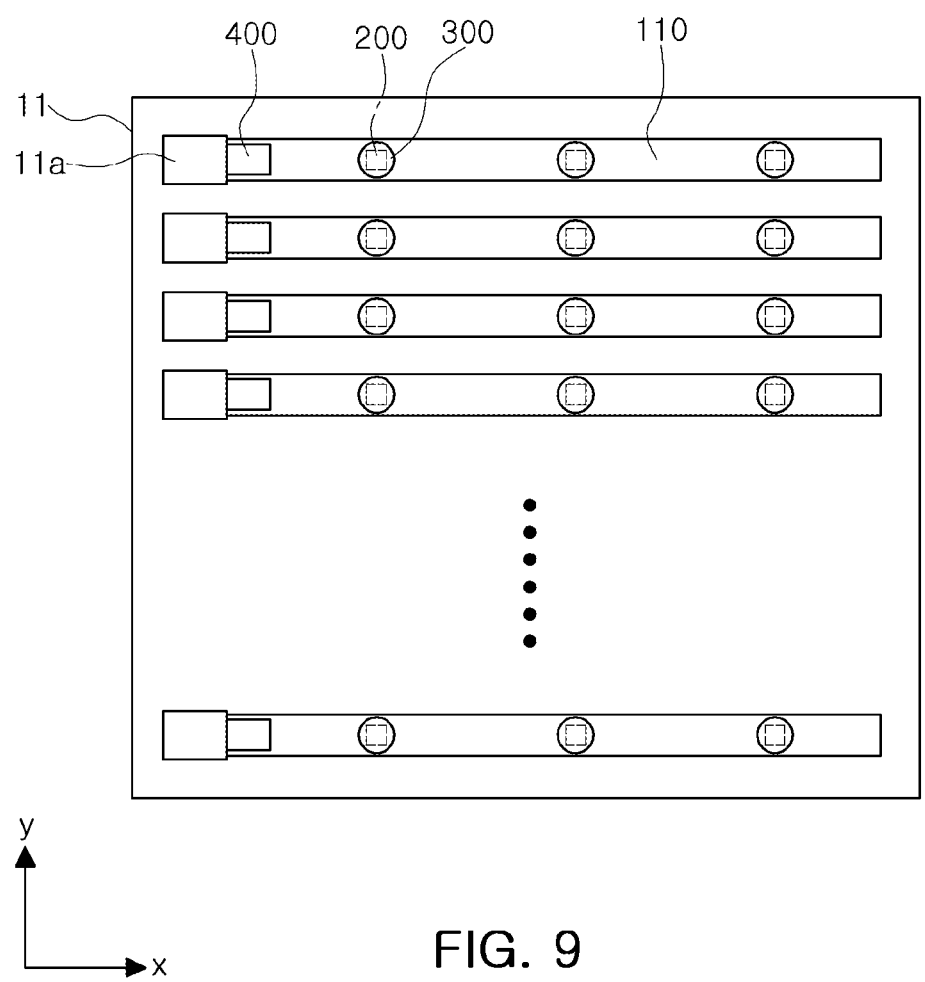
FIG. 9 is a plan view schematically illustrating a process of mounting a plurality of optical devices on the plurality of substrates according to some example embodiments of the inventive concepts.

As illustrated in FIG. 9, the plurality of optical devices 300 covering the plurality of light emitting devices 200 on each of the substrates 110 may be mounted.

The attachment of the optical devices 300 may be performed through a reflow process in which the optical devices 300 are attached to the substrate 110 or the light emitting devices 200 through an adhesive and then, are heat-cured. In some example embodiments, the optical devices 300 are attached onto the substrate 110. In some example embodiments, the optical devices 300 may be attached to the light emitting devices 200. In some example embodiments, the optical devices 300 may be attached by a method other than a heat-curing method.

The optical devices 300 may be mounted such that they cover each of the light emitting devices 200. The optical devices 300 may be formed of a material having light-transmissive properties allowing light emitted by each of the light emitting devices 200 to be irradiated outwardly. For example, a material of the optical devices 300 may include polycarbonate (PC) or polymethylmethacrylate (PMMA), acrylics and the like.

Figure 10:
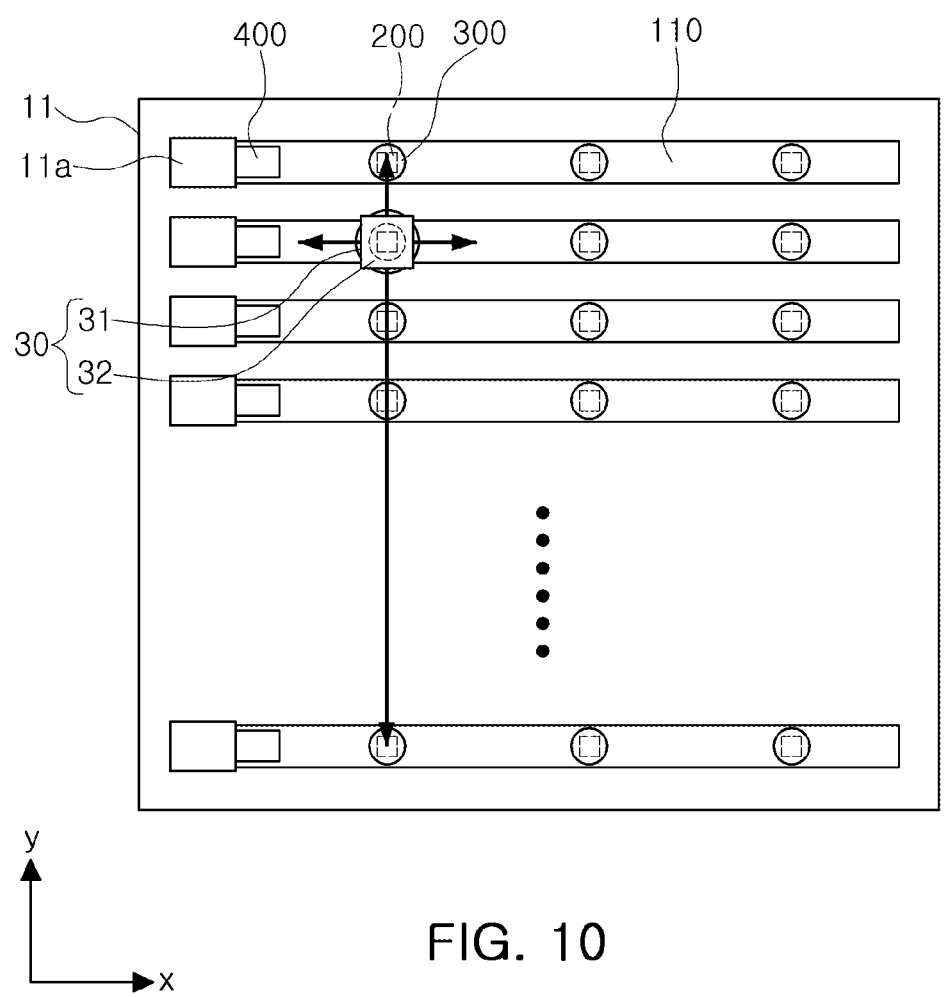
FIG. 10 is a plan view schematically illustrating a process of inspecting the plurality of optical devices according to some example embodiments of the inventive concepts.

As illustrated in FIG. 10, the inspection of the plurality of optical devices 300 may be performed (a second inspection process).

The inspection of the plurality of optical devices 300 may include selectively capturing at least one image of each of the plurality of optical devices 300. The inspection of the plurality of optical devices 300 may include processing one or more of the captured images of an optical device 300 to determine whether the optical device 300 is defective. The inspection of the plurality of optical devices 300 may be performed through an automatic optical inspection using the apparatus 1 for inspecting the light source module (refer to FIG. 1), similar to the inspection of the plurality of light emitting devices 200 as described above.

If and/or when the plurality of substrates 110 on which the plurality of light emitting devices 200 and the plurality of optical devices 300 covering the plurality of light emitting devices 200 are mounted on the carrier 11, and if and/or when the carrier 11 is transferred in the first direction and is disposed on the carrier support pedestal 10, a current may be supplied to the plurality of light emitting devices 200 through the power supply unit 20 and thus, the plurality of light emitting devices 200 may be turned on (selectively activated).

Then, one or more images of the plurality of optical devices 300 may be captured by the light source module scanner assembly 30 if and/or when the light emitting devices 200 are turned on, while the upper surface of the carrier 11 may be scanned by the light source module scanner assembly 30.

The scanner control device 40 may determine whether or not the optical devices 300 are defective based on processing data obtained by the light source module scanner assembly 30. Such data may include one or more images captured by the light source module scanner assembly 30, where the captured one or more images are images of the optical devices 300. The defects of the optical devices 300 may include an alignment defect in which the optical device is misaligned, a tilting defect in which the optical device 300 is mounted in a titled state, a foreign defect due to a defect of the optical device 300 itself, some combination thereof, or the like. When the defect is detected in a portion of the optical devices 300, a process of replacing the corresponding defective optical device 300 with a good product or a process of remounting the optical device 300 may be separately performed.

The scanner control device 40 may control the movement direction of the light source module scanner assembly 30. For example, the scanner control device 40 may select a movement direction of the camera assembly 31, of the first direction or the second direction, and may rotate the camera assembly 31 by controlling the rotating jig 32.

For example, based on at least one of the quantity of substrates 110 arranged on the carrier 11 and the quantity of light emitting devices 200 and optical devices 300 mounted on each of the substrates 110, a movement direction of the light source module scanner assembly 30 may be selected. In response to selecting the movement direction, the scanner control device 40 may determine whether or not to rotate the camera assembly 31 to align with the selected movement direction.

A method of selecting the movement direction of the light source module scanner assembly 30 will be described with reference to FIG. 11, FIG. 12, FIG. 13, and FIG. 14.

Figure 11:
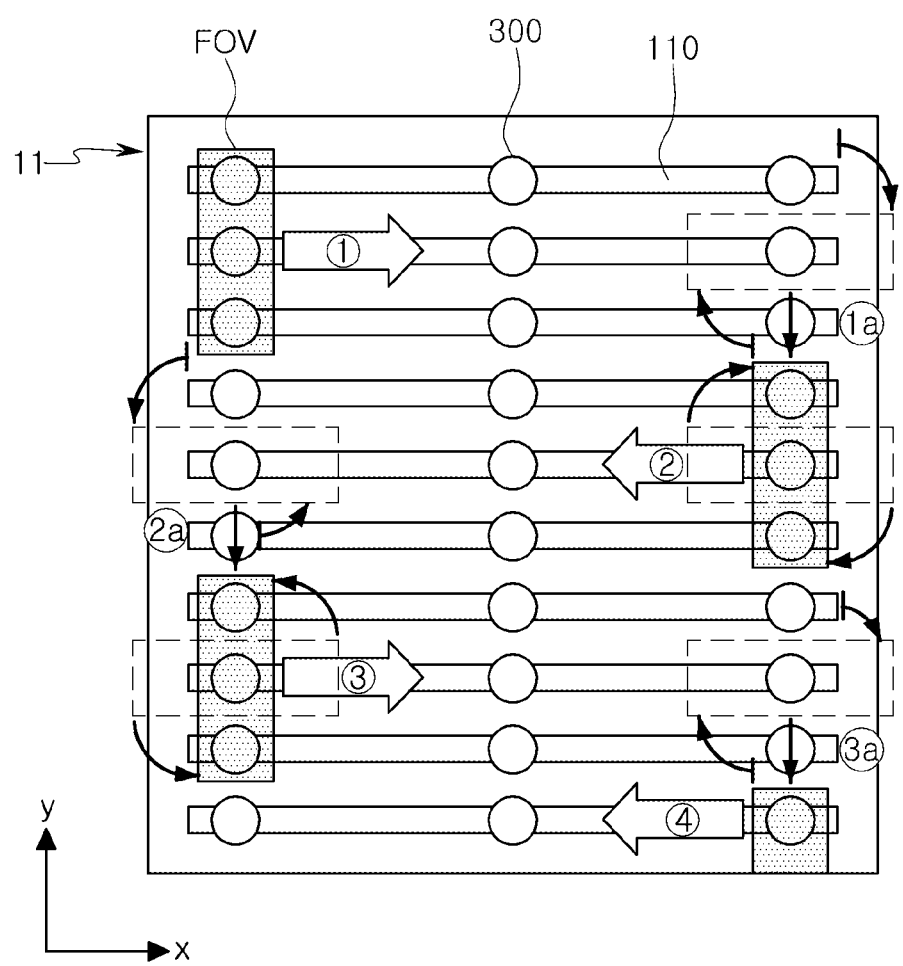
FIG. 11, FIG. 12, FIG. 13, and FIG. 14 are plan views schematically illustrating a process of selecting a movement direction of an imaging part according to some example embodiments of the inventive concepts.
Figure 12:
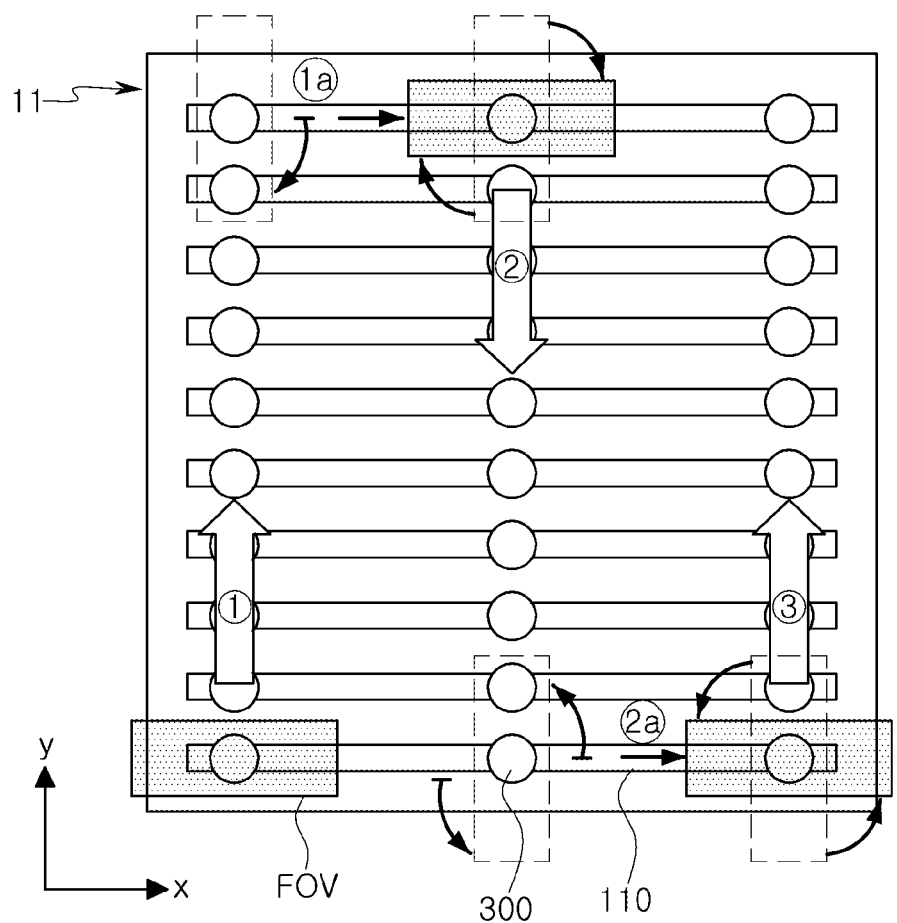

FIGS. 11 and 12 illustrate a case, according to some example embodiments, in which ten substrates 110 are spaced apart in the second direction on the carrier 11, and three optical devices 300 covering the light emitting devices 200 are mounted on each of the substrates 110. In the example embodiments illustrated in FIGS. 11-12, a field of view (FOV) value of a line scanning camera used as the camera assembly may encompass three (3) optical devices 300.

In some example embodiments, as illustrated in FIG. 11, if and/or when the camera assembly moves in the first direction, the camera assembly may move four times to scan (e.g., capture one or more images of) the entirety of the optical devices 300 arranged on the carrier 11.

As shown in FIG. 11, the light source module scanner assembly may be rotated upon the completion of each movement of the light source module scanner assembly in the first direction. The light source module scanner assembly may be rotated and moved to align the light source module scanner assembly with the first direction along an axis that is parallel to the axis of the previous movement in the first direction. The axes may be spaced apart in the second direction, as shown in FIG. 11.

For example, upon being moved (1) in the first direction, the light source module scanner assembly may be rotated to align with the second direction, moved (1a) in the second direction, and rotated to align with the first direction so that the light source module scanner assembly may be moved (2) in the first direction.

In some example embodiments, as illustrated in FIG. 12, if and/or when the camera assembly moves in the second direction, the camera assembly may move three times to scan (e.g., capture one or more images of) the entirety of the optical devices 300 arranged on the carrier 11.

As shown in FIG. 12, the light source module scanner assembly may be rotated upon the completion of each movement of the light source module scanner assembly in the second direction. The light source module scanner assembly may be rotated and moved to align the light source module scanner assembly with the second direction along an axis that is parallel to the axis of the previous movement in the second direction. The axes may be spaced apart in the first direction, as shown in FIG. 12.

For example, upon being moved (1) in the second direction, the light source module scanner assembly may be rotated to align with the first direction, moved (1a) in the first direction, and rotated to align with the second direction so that the light source module scanner assembly may be moved (2) in the second direction.

Thus, it may be determined, by the scanner control device 40 and/or one or more devices, that the movement of the camera assembly in the second direction may lead to a reduction in inspection time based on a determination that moving the camera assembly in the second direction may result in a reduced quantity of movements of the camera assembly, relative to moving the camera assembly in the first direction. The scanner control device 40 may select a movement direction of the camera assembly 31 based on information regarding at least one of the quantity of substrates 110 arranged on the carrier 11 and the quantity of light emitting devices 200 and optical devices 300 mounted on each of the substrates 110. The scanner control device 40 may select the second direction as the movement direction and may rotate the camera assembly 31 to align with the selected second direction by controlling an operation of the rotating jig 32.

Figure 13:
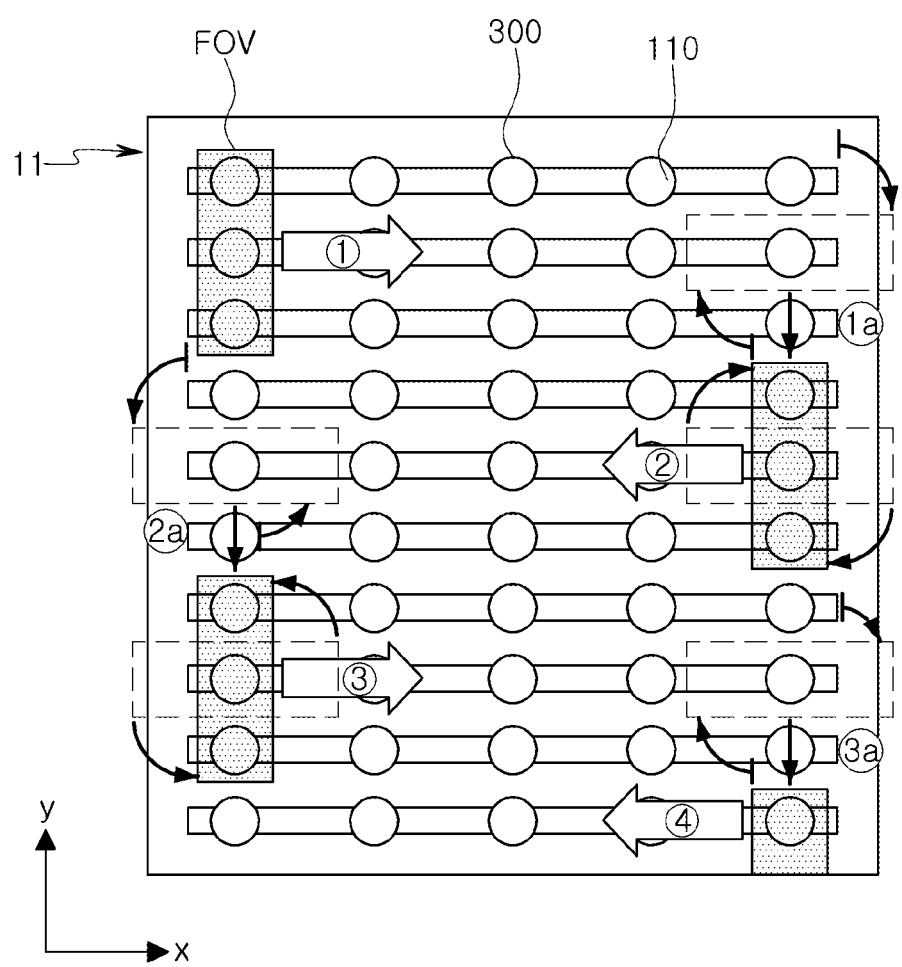
Figure 14:
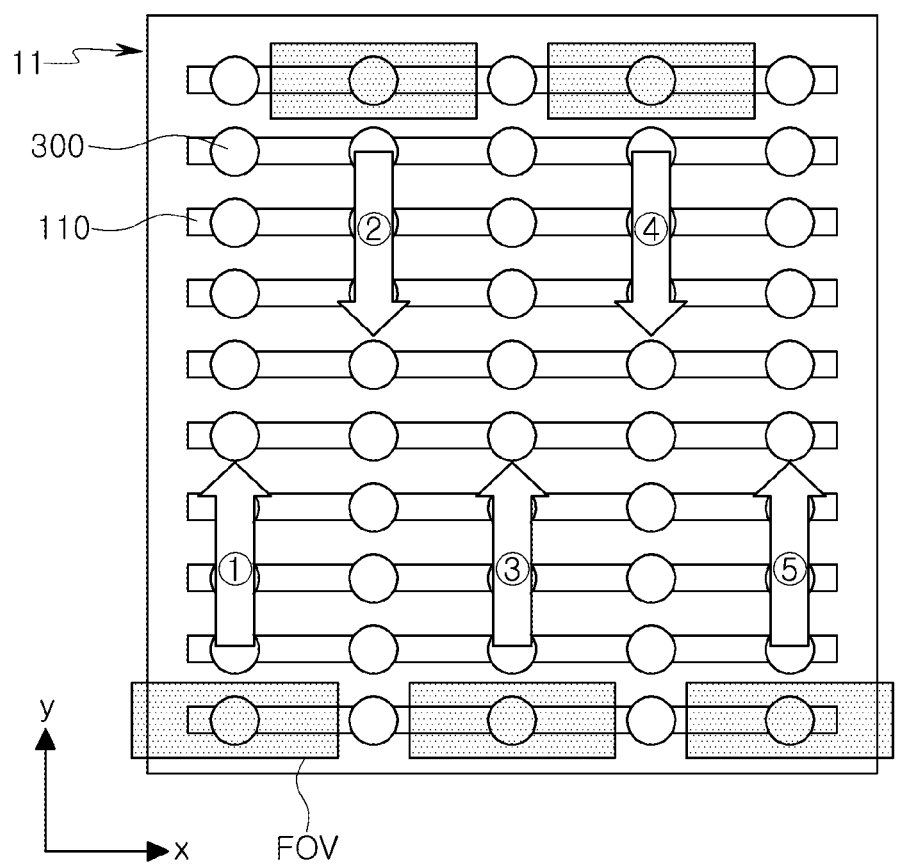

FIGS. 13 and 14 illustrate a case, according to some example embodiments, in which ten substrates 110 are spaced apart in the second direction on the carrier 11, and five optical devices 300 are mounted on each of the substrates 110 to cover the light emitting devices 200. In the example embodiments illustrated in FIGS. 13-14, a field of view (FOV) value of a line scanning camera used as the camera assembly may encompass three (3) optical devices 300.

In some example embodiments, as illustrated in FIG. 13, if and/or when the camera assembly may move in the first direction, the camera assembly may move four times to scan (e.g., capture one or more images of) the entirety of the optical devices 300 arranged on the carrier 11.

As shown in FIG. 13, the light source module scanner assembly may be rotated upon the completion of each movement of the light source module scanner assembly in the first direction. The light source module scanner assembly may be rotated and moved to align the light source module scanner assembly with the first direction along an axis that is parallel to the axis of the previous movement in the first direction. The axes may be spaced apart in the second direction, as shown in FIG. 13.

For example, upon being moved (1) in the first direction, the light source module scanner assembly may be rotated to align with the second direction, moved (1a) in the second direction, and rotated to align with the first direction so that the light source module scanner assembly may be moved (2) in the first direction.

In some example embodiments, as illustrated in FIG. 14, if and/or when the camera assembly moves in the second direction, the camera assembly may move five times to scan e.g., capture one or more images of) the entirety of the optical devices 300 arranged on the carrier 11.

Thus, it may be determined, by the scanner control device 40 and/or one or more devices, that the movement of the camera assembly in the first direction may lead to a reduction in inspection time based on a determination that moving the camera assembly in the first direction may result in a reduced quantity of movements of the camera assembly, relative to moving the camera assembly in the second direction. When the scanner control device 40 selects the first direction through the determination thereof, it may control the rotating jig 32 and rotate the camera assembly 31 to align with the selected first direction.

In this manner, the plurality of light emitting devices 200 and the optical devices 300 may be inspected in a process of manufacturing the light source module 100 to thereby reduce a probability of and/or prevent a defective product from being delivered to a customer through the input or shipment thereof in the subsequent process. By doing so, the occurrence of additional defects such as the breakage of a product and the consequent degradation in product reliability, the damage of a product image, compensation for damage, and the like may be reduced and/or prevented in advance.

In particular, in inspecting the plurality of light emitting devices 200 and the optical devices 300, the camera assembly 31 may be connected to the rotating jig 32 and may be selectively rotated, based on control of the rotating jig 32 by the scanner control device 40, to move in the selected direction. Thus, unlike a related art case in which a camera assembly only moves in one direction in a fixed state thereof, the scanner control device 40 may select a desired movement direction among a plurality of movement directions and may control the light source module scanner assembly 30 to move the camera assembly 31 in the selected movement direction. Thus, inspection time may be reduced. Reduced inspection times may result in improvements in productivity.

Figure 15A:
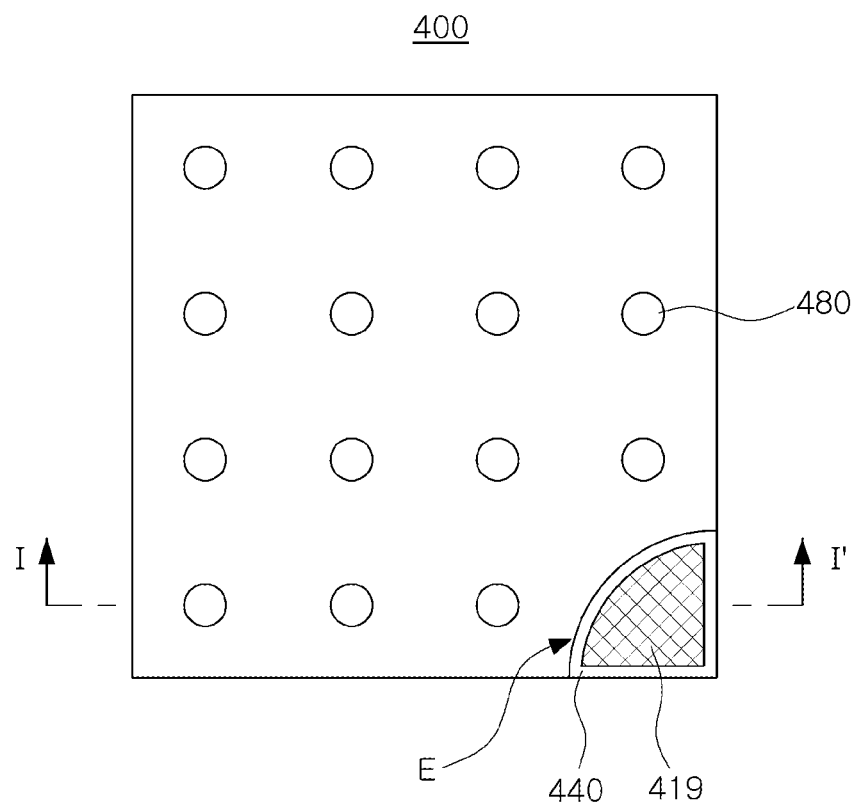
FIG. 15A is a plan view illustrating an example of an LED chip employable in some example embodiments of the inventive concepts.
Figure 15B:
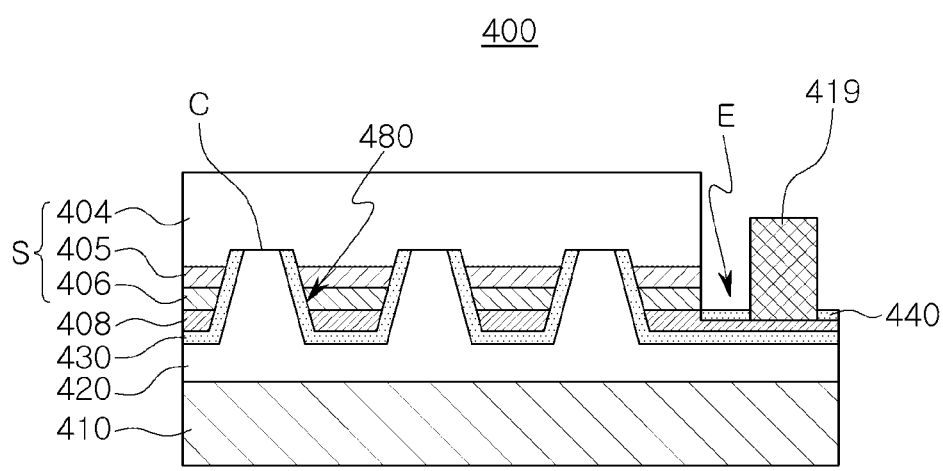
FIG. 15B is a side cross-sectional view of the LED chip illustrated in FIG. 15A, taken along line I-I'.
Figure 16:
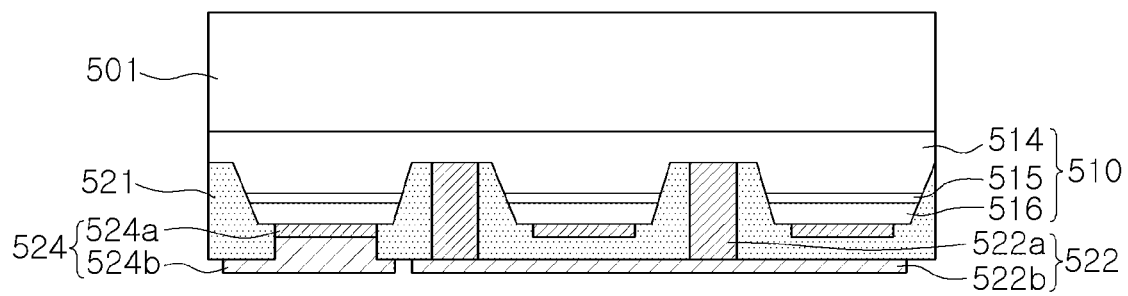
FIG. 16 is a side cross-sectional view illustrating an example of an LED chip employable in some example embodiments of the inventive concepts.

FIG. 15A, FIG. 15B, and FIG. 16 schematically illustrate various examples of an LED chip employable in alight source module according to some example embodiments of the inventive concepts. FIG. 15A, FIG. 15B, and FIG. 16 are views illustrating various examples of an LED chip employable in a light emitting device.

FIG. 15A is a plan view illustrating an example of an LED chip employable in some example embodiments of the inventive concepts, and FIG. 15B is a side cross-sectional view of the LED chip illustrated in FIG. 15A, taken along line I-I'.

An LED chip 400 illustrated in FIG. 15A and FIG. 15B may have a large area structure for a high lighting output. The LED chip 400 may be structured to increase current dispersion efficiency and heat radiation efficiency.

The LED chip 400 may include a light emitting laminate S, a first electrode 420, an insulating layer 430, a second electrode 408, and a conductive substrate 410. The light emitting laminate S may include a first conductivity-type semiconductor layer 404, an active layer 405, and a second conductivity-type semiconductor layer 406 sequentially stacked on one another.

The first conductivity-type semiconductor layer 404 may be a nitride semiconductor satisfying n-type $In_xAl_yGa_{1-x-y}N$ ($0 \leq x<1$, $0 \leq y<1$, $0 \leq x+y<1$), and an n-type dopant may be silicon (Si). For example, the first conductivity-type semiconductor layer 404 may be n-type GaN.

The second conductivity-type semiconductor layer 406 may be a nitride semiconductor layer satisfying p-type $In_xAl_yGa_{1-x-y}N$ ($00 \leq <1$, $0 \leq y<1$, $0 \leq x+y<1$), and a p-type dopant may be magnesium (Mg). For example, the second conductivity-type semiconductor layer 406 may be p-type GaN.

The active layer 405 may have a multiple quantum well (MQW) structure in which quantum well layers and quantum barrier layers are alternately stacked. For example, the quantum well and quantum barrier layers may be formed of different compositions of $In_xAl_yGa_{1-x-y}N$. In some example embodiments, the quantum well layer may be $In_xGa_{1-x}N$ ($0<x \leq 1$) and the quantum barrier layer may be GaN or AlGaN. A thickness of each of the quantum well and quantum barrier layers may range from about 1 nm to 50 nm. The structure of the active layer 405 is not limited to the multiple quantum well (MQW) structure and may also be a single quantum well (SQW) structure.

The first electrode 420 may include one or more conductive vias 480 electrically insulated from the second conductivity-type semiconductor layer 406 and the active layer 405 and extended to at least a portion of the first conductivity-type semiconductor layer 404 in order to be electrically connected to the first conductivity-type semiconductor layer 404. The conductive vias 480 may pass through the second electrode 408, the second conductivity-type semiconductor layer 406, and the active layer 405 from an interface of the first electrode 420 and may be extended to the interior of the first conductivity-type semiconductor layer 404. The conductive vias 480 may be formed using an etching process, for example, an inductively coupled plasma-reactive ion etching (ICP-RIE) or the like.

An insulating layer 430 may be provided on the first electrode 420 to electrically insulate the first electrode 420 from other regions except for the first conductivity-type semiconductor layer 404. As illustrated in FIG. 15B, the insulating layer 430 may also be formed on a side surface of the conductive via 480, as well as between the second electrode 408 and the first electrode 420. By doing so, the second electrode 408, the second conductivity-type semiconductor layer 406, and the active layer 405 exposed to the side surface of the conductive via 480 may be insulated from the first electrode 420. The insulating layer 430 may be formed by the deposition of an insulating material such as SiO2, SiOxNy, or SixNy.

A contact region C of the first conductivity-type semiconductor layer 404 may be exposed by the conductive via 480, and a portion of the first electrode 420 may be formed to contact the contact region C through the conductive via 480. By doing so, the first electrode 420 may be connected to the first conductivity-type semiconductor layer 404.

The number, shape, or pitch of the conductive vias 480 or a contact diameter (or a contact area) thereof with respect to the first and second conductivity-type semiconductor layers 404 and 406 may be appropriately adjusted so as to reduce contact resistance (Refer to FIG. 15A). Further, the conductive vias 480 may be variously arranged in rows and columns, whereby a current flow may be improved. The number of the conductive vias 480 or the contact area thereof may be adjusted such that an area of the contact region C may range from about 0.1% to 20%, for example, 0.5% to 15%, further, 1% to 10%, of a planar area of the light emitting laminate S. In a case in which the electrode area is less than 0.1%, current dispersion may not be uniform to deteriorate light emission efficiency. On the other hand, in a case in which the electrode area is equal to or greater than 20%, a light emitting area may be relatively reduced, thereby leading to decreases in light emission properties and luminance properties.

A radius of each conductive via 480 in the contact area coming into contact with the first conductivity-type semiconductor layer 404 may be, for example, approximately 1 μm to 50 μm. The number of the conductive vias 480 may be 1 to 48000 per region of the light emitting laminate S, depending on an area of the region of the light emitting laminate S. The number of the conductive vias 480 may be 2 to 45000, particularly, 5 to 40000, more particularly, 10 to 35000, per region of the light emitting laminate S, but may be varied depending on an area of the region of the light emitting laminate S. Distances between the respective conductive vias 480 may have a matrix structure having rows and columns of 10 μm to 1000 μm, for example, rows and columns of 50 μm to 700 μm, particularly, rows and columns of 100 μm to 500 μm, more particularly, rows and columns of 150 μm to 400 μm.

In the case that the distances between the respective conductive vias 480 are smaller than 10 μm, the number of the conductive vias 480 may be increased while a light emitting area may be relatively reduced, thereby leading to a decrease in light emission efficiency. In the case that the distances between the respective conductive vias 480 are greater than 1000 μm, current dispersion may not be facilitated to deteriorate light emission efficiency. Depths of the conductive vias 480 may be differently formed depending on thicknesses of the second conductivity-type semiconductor layer 406 and the active layer 405 and for example, may range from 0.1 μm to 5.0 μm.

As illustrated in FIG. 15B, the second electrode 408 may provide an electrode forming region E extended and exposed externally from the light emitting laminate S. The electrode forming region E may include an electrode pad portion 419 for connecting an external power source to the second electrode 408. In some example embodiments, a single electrode forming region E is provided. In some example embodiments, the electrode forming region E may be provided in plural. As illustrated in FIG. 15A, the electrode forming region E may be formed on one edge of the LED chip 400 in order to significantly increase a light emitting area.

In some example embodiments, an insulating layer 440 for stopping etching may be disposed in the perimeter of the electrode pad portion 419. The insulating layer 440 for stopping etching may be formed in the electrode forming region E prior to the forming of the second electrode 408 after the light emitting laminate S has been formed, and may serve as an etching stopping layer during an etching process for the electrode forming region E.

The second electrode 408 may be formed of a material having a high degree of reflectivity while forming an ohmic-contact with the second conductivity-type semiconductor layer 406. The material of the second electrode 408 may be a reflective electrode material, previously exemplified.

FIG. 16 is a side cross-sectional view illustrating an example of an LED chip 500 employable in some example embodiments of the inventive concepts.

Referring to FIG. 16, the LED chip 500 may include a semiconductor laminate 510 formed on a substrate 501. The semiconductor laminate 510 may include a first conductivity-type semiconductor layer 514, an active layer 515, and a second conductivity-type semiconductor layer 516.

The LED chip 500 may include first and second electrodes 522 and 524 connected to the first and second conductivity-type semiconductor layers 514 and 516, respectively. The first electrode 522 may include a connection electrode portion 522a such as a conductive via, which penetrates through the second conductivity-type semiconductor layer 516 and the active layer 515 to be connected to the first conductivity-type semiconductor layer 514, and a first electrode pad 522b connected to the connection electrode portion 522a. The connection electrode portion 522a may be surrounded by an insulating portion 521 and may be electrically separated from the active layer 515 and the second conductivity-type semiconductor layer 516. The connection electrode portion 522a may be disposed in an etched region of the semiconductor laminate 510. The number, shape, or pitch of the connection electrode portion 522a or a contact area thereof with respect to the first conductivity-type semiconductor layer 514 may be appropriately designed so as to reduce contact resistance. Further, the connection electrode portion 522a may be arranged in rows and columns on the semiconductor laminate 510, whereby a current flow may be improved. The second electrode 524 may include an ohmic-contact layer 524a and a second electrode pad 524b on the second conductivity-type semiconductor layer 516.

Each of the connection electrode portion 522a and the ohmic-contact layer 524a may include a single layer or multilayer structure of a conductive material having ohmic-characteristics with the first and second conductivity-type semiconductor layers 514 and 516. For example, the connection electrode portion and the ohmic-contact layer 522a and 524a may be formed by a process such as depositing or sputtering one or more of Ag, Al, Ni, Cr, a transparent conductive oxide (TCO) and the like.

The first and second electrode pads 522b and 524b may be connected to the connection electrode portion 522a and the ohmic-contact layer 524a to serve as external terminals of the LED chip 500. For example, the first and second electrode pads 522b and 524b may be formed of Au, Ag, Al, Ti, W, Cu, Sn, Ni, Pt, Cr, NiSn, TiW, AuSn or eutectic metals thereof.

The first and second electrodes 522 and 524 may be disposed in the same direction and may be mounted on the lead frame or the like, in a flip-chip scheme.

In some example embodiments, the two electrodes 522 and 524 may be electrically separated from each other by the insulating portion 521. The insulating portion 521 may be formed of any material, as long as the material has electrical insulating properties. Any material having electrical insulating properties while having a low degree of light absorptivity may be employed. For example, the insulating portion 521 may be formed of a silicon oxide or a silicon nitride such as SiO2, SiOxNy, SixNy or the like. In some example embodiments, a light reflecting structure may be formed by dispersing light reflective fillers in a light transmissive material. Conversely, the insulating portion 521 may have a multilayer reflection structure in which a plurality of insulating layers having different refractive indices may be alternately stacked. For example, such a multilayer reflection structure may be a distributed Bragg reflector (DBR) in which a first insulating layer having a first refractive index and a second insulating layer having a second refractive index are alternately stacked.

The multilayer reflection structure may be formed by repeatedly stacking a plurality of insulating layers having different reflective indices 2 times to 100 times, for example, 3 times to 70 times, further, 4 times to 50 times. The plurality of insulating layers of the multilayer reflection structure may be formed of an oxide or nitride and combinations thereof, such as SiO2, SiN, SiOxNy, TiO2, Si3N4, Al2O3, TiN, AlN, ZrO2, TiAlN, TiSiN or the like. For example, when a wavelength of light generated in the active layer is $\lambda$, and a refractive index of the corresponding layer is n, the first insulating layer and the second insulating layer may be formed to have a thickness of $\lambda/4n$, approximately 300 Å to 900 Å. In the case, the refractive indices and thickness of the first insulating layer and the second insulating layer may be selectively designed such that the insulating layers have a high degree of reflectance (95% or more) with respect to the wavelength of light generated in the active layer 515.

The refractive indices of the first insulating layer and the second insulating layer may be determined to be within a range of about 1.4 to about 2.5 and may be lower than refractive indices of the first conductivity-type semiconductor layer 514 and the substrate, but may also be higher than the refractive index of the substrate while being lower than the refractive index of the first conductivity-type semiconductor layer 514.

Figure 17:
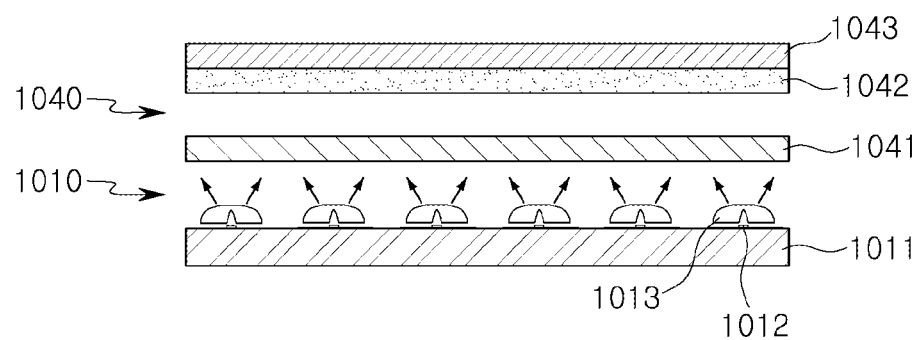
FIG. 17 is a cross-sectional view schematically illustrating a lighting device according to some example embodiments of the inventive concepts.

With reference to FIG. 17, a lighting device employing a light source module according to some example embodiments of the inventive concepts will be described. FIG. 17 schematically illustrates a lighting device according to some example embodiments of the inventive concepts.

Referring to FIG. 17, a lighting device 1000 may have, by way of example, a surface light source type structure, and may be a direct type backlight unit.

The lighting device 1000 may include an optical sheet 1040 and a light source module 1010 arranged below the optical sheet 1040.

The optical sheet 1040 may include a diffusion sheet 1041, a light collecting sheet 1042, a protective sheet 1043, and the like.

The light source module 1010 may include a board 1011, a plurality of light emitting devices 1012 mounted on an upper surface of the board 1011, and a plurality of optical devices 1013 covering the plurality of respective light emitting devices 1012. In some example embodiments, the light source module 1010 may have a structure substantially similar to the light source module 100 of FIG. 2. A concrete description regarding respective components of the light source module 1010 may be understood with reference to the foregoing example embodiments.

As set forth above, according to some example embodiments of the inventive concepts, a method of manufacturing a light source module, capable of increasing the reliability and productivity of a product by inspecting a cause of an optical uniformity defect such as Mura phenomenon and removing the cause in the manufacturing of the light source module, may be provided.

Figure 18:
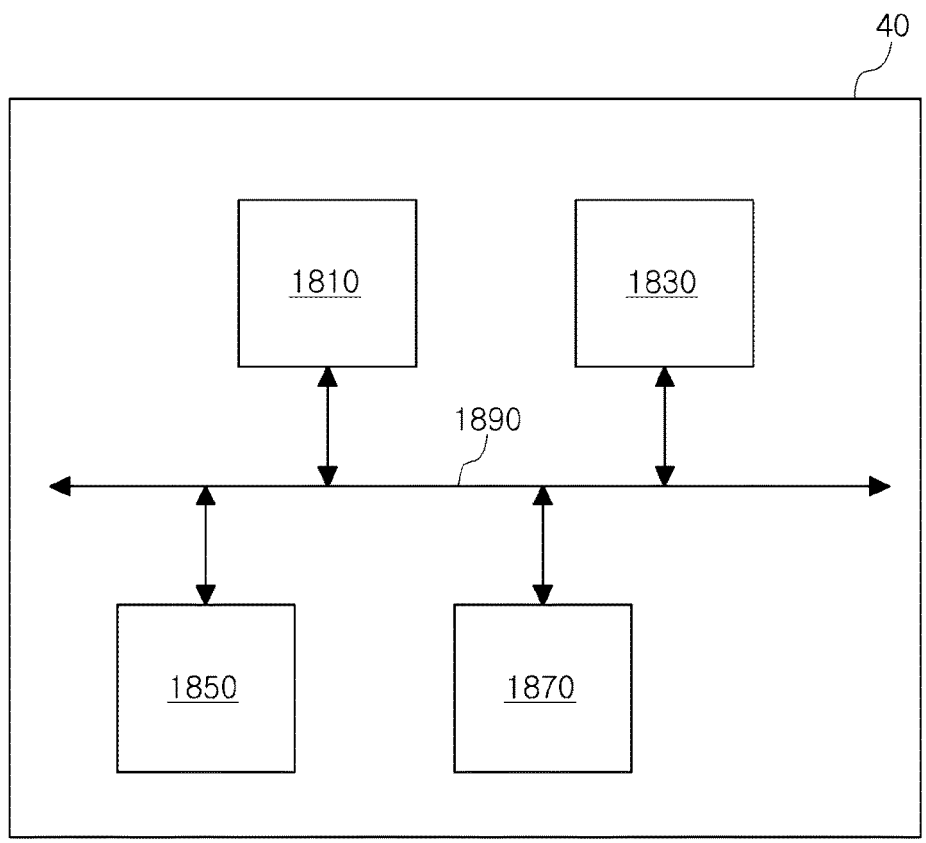
FIG. 18 is a block diagram illustrating a scanner control device, according to some example embodiments of the inventive concepts.

FIG. 18 is a block diagram illustrating a scanner control device 40, according to some example embodiments of the inventive concepts. A scanner control device 40 may include a computer processing device. Referring to FIG. 18, a scanner control device 40 may include a processing device ("processor") 1810, a memory 1830, an input-output device 1850, and a storage device 1870. In some example embodiments, the scanner control device 40 may include a computing system configured to carry out various inspection programs. Such inspection programs may include computer-executable program instructions to control the light source module scanner assembly 30 as described above.

The processing device 1810 (also referred to as a "processor") may be configured to run a variety of instances of software, such as application programs, operating systems, and device drivers. For example, the processing device 1810 may be configured to run an operating system (not shown) loaded on the working memory 1830. Further, the processing device 1810 may be configured to run various application programs on the operating system. For example, the processing device 1810 may be configured to control the light source module scanner assembly 30 as described above.

The operating system or application programs may be loaded on the working memory 1830. For example, when the computer system starts a booting operation, an OS image (not shown) stored in the storage device 1870 may be loaded on the working memory 1830 according to a booting sequence. In the scanner control device 40, overall input/output operations may be managed by the operating system. Similarly, some application programs ("computer-executable programs of instruction") may be loaded on the working memory 1830.

The working memory (also referred to as a "memory") 1830 may be one of volatile memory devices (e.g., static random access memory (SRAM) or dynamic random access memory (DRAM) devices) or nonvolatile memory devices (e.g., PRAM, MRAM, ReRAM, FRAM, NOR FLASH memory devices).

The input-output device 1850 may be configured to control user input and output operations of user interface devices. For example, the input-output device 1850 may include a keyboard or a monitor, allowing an operator to input relevant information, instructions, some combination thereof, or the like.

The storage device (also referred to as a "memory") 1870 may serve as a non-transitory storage medium for the scanner control device 40. The storage device 1870 may be configured to store application programs, an OS image, and various data. The storage device 1870 may be provided in the form of one of memory cards (e.g., MMC, eMMC, SD, MicroSD, and so forth) or a hard disk drive (HDD). The storage device 1870 may include a NAND FLASH memory device with a large memory capacity. The storage device 1870 may include at least one of next-generation nonvolatile memory devices (e.g., PRAM, MRAM, ReRAM, or FRAM) or NOR FLASH memory devices.

A system interconnector 1890 may be provided to serve as a system bus for realizing a network in the scanner control device 40. The processor device 1810, the working memory 1830, the input-output device 1850, and the storage device 1870 may be electrically connected to each other through the system interconnector 1890, and thus, data may be exchanged therebetween. However, the system interconnector 1890 may not be limited to the afore-described configuration; for example, it may further include an additional element for increasing efficiency in data communication.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of manufacturing a light source module, the method comprising:
    disposing a plurality of substrates on an upper surface of a carrier, wherein the plurality of substrates respectively extend in parallel and in a first direction, the plurality of substrates are spaced apart in a second direction, and the second direction is substantially perpendicular to the first direction;
    mounting a plurality of light emitting devices on the plurality of substrates;
    mounting a plurality of optical devices to cover the plurality of light emitting devices on the plurality of substrates; and
    selectively capturing at least one image of each of the light emitting devices and the optical devices, based on controlling an light source module scanner assembly on the upper surface of the carrier, the controlling including
        selectively moving the light source module scanner assembly along a selected movement direction of the first direction or the second direction to position the light source module scanner assembly on at least one of the light emitting devices and the optical devices, and
        controlling the light source module scanner assembly to capture an image of the at least one of the light emitting devices and the optical devices.

2. The method of claim 1, wherein selectively moving the light source module scanner assembly along the selected movement direction includes
    selecting the first direction or the second direction as the selected movement direction based on
        a quantity of the plurality of substrates on the carrier, and
        a quantity of light emitting devices and optical devices on each of the substrates; and
    determining whether to rotate the light source module scanner assembly, based on the selected movement direction.

3. The method of claim 1, wherein selectively capturing at least one image of each of the light emitting devices and the optical devices includes
    controlling the light source module scanner assembly to selectively capture at least one first image of each of the light emitting devices, and
    controlling the light source module scanner assembly to selectively capture at least one second image of each of the optical devices.

4. The method of claim 3, wherein selectively capturing at least one image of each of the light emitting devices and the optical devices includes
    controlling the light source module scanner assembly to selectively capture at least one first image of each of the light emitting devices prior to mounting the plurality of optical devices to cover the plurality of light emitting devices on the plurality of substrates; and
    controlling the light source module scanner assembly to selectively capture at least one second image of each of the optical devices subsequently to mounting the plurality of optical devices to cover the plurality of light emitting devices on the plurality of substrates.

5. The method of claim 1, wherein selectively capturing at least one image of each of the light emitting devices and the optical devices includes
    selectively activating the light emitting devices,
    capturing at least one image of each of the selectively activated light emitting devices, and
    capturing at least one image of each of the optical devices on the selectively activated light emitting devices.

6. The method of claim 1, further comprising:
    moving the carrier in the first direction to dispose the carrier on a carrier support pedestal.

7. The method of claim 1, wherein the light source module scanner assembly includes
    a camera assembly, and
    a rotating jig connected to the camera assembly.

8. The method of claim 7, wherein the camera assembly includes an area scanning camera or a line scanning camera.

9. The method of claim 1, wherein the plurality of light emitting devices and optical devices extend substantially parallel to a longitudinal axis of the substrates.

10. The method of claim 1, wherein each of the light emitting devices includes at least one light emitting diode (LED) chip.

11. The method of claim 1, wherein
    the carrier includes a plurality of terminals, and
    the method includes electrically coupling the plurality of substrates to separate ones of the terminals.

12. A method of manufacturing a light source module, the method comprising:
    selectively capturing at least one image of each of a plurality of light emitting devices on a plurality of substrates and a plurality of optical devices on the plurality of light emitting devices, based on controlling an light source module scanner assembly on an upper surface of a carrier, the plurality of substrates being on the upper surface of the carrier, wherein the plurality of substrates respectively extend in parallel and in a first direction, the plurality of substrates are spaced apart in a second direction, and the second direction is substantially perpendicular to the first direction,
    wherein the controlling the light source module scanner assembly includes
        selectively rotating the light source module scanner assembly to align the light source module scanner assembly with a selected movement direction, the selected movement direction being a selected one of the first direction or the second direction, and moving the light source module scanner assembly along the selected movement direction to position the light source module scanner assembly on at least one of the light emitting devices and the optical devices.

13. The method of claim 12, wherein controlling the light source module scanner assembly includes
selecting the selected movement direction based on
a quantity of the substrates, and
a quantity of the light emitting devices and the optical devices mounted on each of the substrates; and
determining whether to rotate the light source module scanner assembly, based on the selected movement direction.

14. The method of claim 12, wherein selectively capturing at least one image of each of the light emitting devices and the optical devices includes
selectively activating the light emitting devices,
capturing at least one image of each of the selectively activated light emitting devices, and
capturing at least one image of each of the optical devices on the selectively activated light emitting devices.

15. The method of claim 12, wherein selectively capturing at least one image of each of the light emitting devices and the optical devices inspecting includes
controlling the light source module scanner assembly to selectively capture at least one first image of each of the light emitting devices, and
controlling the light source module scanner assembly to selectively capture at least one second image of each of the optical devices.

16. A method, comprising:
selectively capturing at least one image of each of a plurality of light emitting devices based on controlling an light source module scanner assembly on the plurality of light emitting devices, the plurality of light emitting devices including a plurality of rows of light emitting devices, each row extending in a first direction, the rows being spaced apart in a second direction, the selectively capturing including
selecting a movement direction, the selected movement direction being one of the first direction or the second direction, based on
a quantity of the rows, and
a quantity of light emitting devices included in each of the rows, and
moving the light source module scanner assembly along the selected movement direction to position the light source module scanner assembly on at least one of the light emitting devices.

17. The method of claim 16, wherein
moving the light source module scanner assembly along the selected movement direction includes rotating the light source module scanner assembly to align with the selected movement direction.

18. The method of claim 16, further comprising:
selectively activating each of the light emitting devices according to an activation sequence; and
moving the light source module scanner assembly according to the activation sequence to capture at least one image of each of the selectively activated light emitting devices.

19. The method of claim 16, further comprising:
determining whether at least one light emitting device is defective based on processing the at least one captured image,
wherein determining whether at least one light emitting device is defective includes determining, whether the at least one light emitting device is at least one of
deactivated, and
mounted in a tilted state.

20. The method of claim 16, further comprising:
disposing a plurality of substrates on an upper surface of a carrier, wherein the plurality of substrates respectively extend in parallel and in a first direction, the plurality of substrates are spaced apart in a second direction, and the second direction is substantially perpendicular to the first direction;
mounting the plurality of light emitting devices on the plurality of substrates; and
moving the carrier in the first direction to dispose the carrier on a carrier support pedestal.

* * * * *